(12) United States Patent
An

(10) Patent No.: US 11,552,213 B2
(45) Date of Patent: Jan. 10, 2023

(54) TEMPLATE FOR GROWING GROUP III-NITRIDE SEMICONDUCTOR LAYER, GROUP III-NITRIDE SEMICONDUCTOR LIGHT EMITTING DEVICE, AND MANUFACTURING METHOD THEREFOR

(71) Applicant: WAVELORD CO., LTD., Gyeonggi-do (KR)

(72) Inventor: Sang Jeong An, Gyeonggi-do (KR)

(73) Assignee: WAVELORD CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/943,186

(22) Filed: Jul. 30, 2020

(65) Prior Publication Data

US 2020/0357948 A1 Nov. 12, 2020

Related U.S. Application Data

(63) Continuation of application No. 16/098,564, filed as application No. PCT/KR2017/004556 on Apr. 28, 2017, now abandoned.

(30) Foreign Application Priority Data

| May 2, 2016 | (KR) | ........................ 10-2016-0054160 |
| May 2, 2016 | (KR) | ........................ 10-2016-0054162 |
| May 3, 2016 | (KR) | ........................ 10-2016-0054575 |

(51) Int. Cl.
*H01L 23/00* (2006.01)
*H01L 33/00* (2010.01)
(Continued)

(52) U.S. Cl.
CPC ............ *H01L 33/007* (2013.01); *H01L 21/48* (2013.01); *H01L 21/561* (2013.01);
(Continued)

(58) Field of Classification Search
CPC ..... H01L 33/007; H01L 23/498; H01L 21/48; H01L 21/568; H01L 21/561; H01L 21/78;
(Continued)

(56) References Cited

U.S. PATENT DOCUMENTS

| 3,736,651 A | 6/1973 | Law et al. |
| 5,132,080 A * | 7/1992 | Pfeil ................... B01D 39/2034 419/2 |

(Continued)

FOREIGN PATENT DOCUMENTS

| KR | 10-2010-0034797 A | 4/2010 |
| KR | 10-2011-0078632 A | 7/2011 |

(Continued)

OTHER PUBLICATIONS

International Search Report from corresponding PCT Application No. PCT/KR2017/004566, dated Aug. 18, 2017.

(Continued)

*Primary Examiner* — Eugene Lee
(74) *Attorney, Agent, or Firm* — Harness, Dickey & Pierce, P.L.C.

(57) ABSTRACT

A template for growing Group III-nitride semiconductor layers, a Group III-nitride semiconductor light emitting device and methods of manufacturing the same are provided. The template for growing Group III-nitride semiconductor layers includes a growth substrate having a first plane, a second plane opposite to the first plane and a groove extending inwards the growth substrate from the first plane, an insert for heat dissipation placed and secured in the groove, and a nucleation layer formed on a partially removed portion of the first plane.

10 Claims, 18 Drawing Sheets

(51) Int. Cl.

| | | |
|---|---|---|
| *H01L 23/498* | (2006.01) | |
| *H01L 21/48* | (2006.01) | |
| *H01L 21/56* | (2006.01) | |
| *H01L 21/78* | (2006.01) | |
| *H01L 33/48* | (2010.01) | |
| *H01L 21/683* | (2006.01) | |
| *H01L 33/64* | (2010.01) | |
| *H01L 33/02* | (2010.01) | |
| *H01L 33/22* | (2010.01) | |
| *H01L 33/32* | (2010.01) | |
| *H01L 33/46* | (2010.01) | |
| *H01L 33/62* | (2010.01) | |

(52) U.S. Cl.
CPC ........ *H01L 21/568* (2013.01); *H01L 21/6835* (2013.01); *H01L 21/78* (2013.01); *H01L 23/00* (2013.01); *H01L 23/498* (2013.01); *H01L 33/00* (2013.01); *H01L 33/0075* (2013.01); *H01L 33/02* (2013.01); *H01L 33/22* (2013.01); *H01L 33/32* (2013.01); *H01L 33/46* (2013.01); *H01L 33/48* (2013.01); *H01L 33/62* (2013.01); *H01L 33/64* (2013.01); *H01L 33/641* (2013.01); *H01L 2221/68327* (2013.01); *H01L 2221/68345* (2013.01); *H01L 2224/48091* (2013.01); *H01L 2224/48227* (2013.01); *H01L 2224/49107* (2013.01); *H01L 2224/73265* (2013.01)

(58) Field of Classification Search
CPC ..... H01L 23/00; H01L 21/6835; H01L 33/64; H01L 33/02; H01L 33/00; H01L 33/0075; H01L 33/22; H01L 33/32; H01L 33/46; H01L 33/62; H01L 33/641; H01L 2224/48091; H01L 2221/68345
See application file for complete search history.

(56) References Cited

U.S. PATENT DOCUMENTS

| | | | |
|---|---|---|---|
| 7,154,121 | B2 | 12/2006 | Hsieh et al. |
| 9,246,305 | B1* | 1/2016 | Kub .................... H01S 5/02484 |
| 9,666,429 | B1 | 5/2017 | Hsu et al. |
| 10,355,168 | B2 | 7/2019 | Lopez |
| 2002/0014629 | A1 | 2/2002 | Shibata et al. |
| 2006/0246722 | A1 | 11/2006 | Speck et al. |
| 2010/0102360 | A1 | 4/2010 | Nakada et al. |
| 2011/0012109 | A1 | 1/2011 | Krylouk et al. |
| 2011/0140080 | A1* | 6/2011 | Xiong ................ H01L 33/0093 |
| | | | 977/840 |
| 2015/0069418 | A1 | 3/2015 | Heo et al. |
| 2016/0380155 | A1* | 12/2016 | Jeong ................ H01L 21/02494 |
| | | | 257/101 |
| 2017/0213718 | A1 | 7/2017 | Sundaram et al. |

FOREIGN PATENT DOCUMENTS

| | | |
|---|---|---|
| KR | 10-2015-0112485 A | 10/2015 |
| KR | 10-2016-0022460 A | 3/2016 |

OTHER PUBLICATIONS

Office Action (Non-Final) from corresponding U.S. Appl. No. 16/098,564, dated Jan. 31, 2020.

* cited by examiner

TEMPLATE FOR GROWING GROUP III-NITRIDE SEMICONDUCTOR LAYER, GROUP III-NITRIDE SEMICONDUCTOR LIGHT EMITTING DEVICE, AND MANUFACTURING METHOD THEREFOR

CROSS-REFERENCE TO RELATED APPLICATIONS

This application is continuation application of U.S. application Ser. No. 16/098,564, filed on 1 Apr. 2019, which is a National Phase application of PCT Application No. PCT/KR2017/004556, filed on 28 Apr. 2017, which claims benefit of Korean Patent Application Nos. 10-2016-0054575, filed on 3 May 2016, 10-2016-0054160, filed on 2 May 2016 and 10-2016-0054162, filed on 2 May 2016. The entire disclosure of the applications identified in this paragraph are incorporated herein by references.

FIELD

The disclosure relates generally to a template for growing Group III-nitride semiconductor layers, a Group III-nitride semiconductor light emitting device, and methods of manufacturing the same. In particular, it relates to a template with enhanced heat dissipation features for growing Group III-nitride semiconductor layers, a Group III-nitride semiconductor light emitting device, and methods of manufacturing the same.

In the context herein, the term "Group III-nitride semiconductor" is intended to indicate an $Al(x)Ga(y)In(1-x-y)N$ ($0<x\leq1$, $0\leq y\leq1$, $0\leq x+y\leq1$) compound semiconductor, and the term "Group III-nitride semiconductor light emitting device" is intended to indicate a light emitting device, e.g., a light emitting diode, a laser diode and so forth, which includes an $Al(x)Ga(y)In(1-x-y)N$ ($0<x\leq1$, $0\leq y\leq1$, $0\leq x+y\leq1$) compound semiconductor layer and optionally, other additional materials or a semiconductor layer made of the additional materials containing elements of other groups, e.g., SiC, SiN, SiCN and CN.

BACKGROUND

This section provides background information related to the present disclosure which is not necessarily prior art.

FIG. 1 and FIG. 2 show an exemplary semiconductor light emitting device described in Japanese Patent Laid-Open Publication No. H08-083929, in which the semiconductor light emitting device includes a growth substrate 100, a nucleation layer (or a seed or buffer layer) 200 grown on the growth substrate 100, a first semiconductor layer 300 grown on the nucleation layer 200, an active layer 400 grown on the first semiconductor layer 300 and adapted to generate light by electron-hole recombination, a second semiconductor layer 500 grown on the active layer 400, a first electrode 700 for supplying either electrons or holes to the second semiconductor layer 500, and a second electrode 800 for supplying the other of the electrons or the holes to the first semiconductor layer 300. After the growth of the semiconductor layers 200, 300, 400 and 500 is completed, an opening 110 is formed in the growth substrate 100 and an electrical connection 810 is also formed by plating such that the second electrode 800 is electrically connected to the first semiconductor layer 300. This electrical connection 810 not only provides an electrical pass to the growth substrate 100 typically made of a non-conductor (e.g., an $Al_2O_3$ substrate), it also serves as a heat dissipation pass. However, it is not easy to form the electrical connection 810 by plating in the growth substrate 100 that typically varies from 80 to 180 μm in thickness.

FIG. 3 shows an exemplary semiconductor light emitting device described in U.S. Patent Application Publication No. 2008-0315240, in which the semiconductor light emitting device includes a growth substrate 100 with an opening 100 formed therein, semiconductor layers 200, 300, 400 and 500 grown on the growth substrate 100, a first electrode 700 for supplying either electrons or holes to the second semiconductor layer 500, and a second electrode 800 for supplying the other of the electrons or the holes to the first semiconductor layer 300, with the second electrode 800 being electrically connected to the first semiconductor layer 300 through an electrical connection 810 on the rear side of the growth substrate 100. For current spreading, a current spreading electrode 600 is preferably formed nearly on the entire surface of the second semiconductor layer 500. This semiconductor light emitting device is different from those semiconductor light emitting devices illustrated in FIG. 1 and FIG. 2 in that the semiconductor layers 200, 300, 400 and 500 are grown after the opening 110 is first formed in the growth substrate 100. It is possible to control the growth conditions of the semiconductor layers 200, 300, 400 and 500 so as to form an opening 900 in the semiconductor layers 200, 300, 400 and 500 during their growth process. At the opening 900, an ohmic electrode 820 is formed at the first semiconductor layer 300 and electrically connected to the second electrode 800. It is also possible to control the growth conditions to grow the semiconductor layers 200, 300, 400 and 500 without forming the opening 900 above the opening 110. In this case, the opening 900 can be formed by etching after the growth process is completed. This prior art also presents many plating techniques for forming a stable electrical connection 810.

FIG. 20 shows an exemplary submount or supporting substrate for a semiconductor device described in Korean Patent Registration No. 10-1432728, in which the supporting substrate for a semiconductor device includes a silicon base 2000 adapted for coupling with and for supporting a semiconductor device 300, a conductive part 15 for conductivity and heat dissipation, and an insulation layer 1600 for insulating the conductive part 15 and the silicon base 2000. To keep abreast of the high-power and/or integration (downsizing) trend in the semiconductor device industry nowadays, a supporting substrate for a semiconductor device is needed to withstand the high temperature, high heat environment. However, when a semiconductor material (e.g., the silicon base 2000) is employed as explained in this document, parasitic capacitance may be generated between the base and the conductive part 15 during the high-power (high-voltage, high-current) usage periods, causing a current leakage. For this reason, the insulation layer 1600 is absolutely necessary. Considering that the melting point of silicon is not that high (e.g., around 1414° C.), it is not easy for the substrate to retain stable physical properties in high temperature operations, and the substrate may rather experience cracking due to a difference in thermal expansion coefficients between the base and the conductive part 15. Moreover, the conductive part 15 in this example is usually obtained by plating. However, the metal itself used for plating thermally expands, and it is difficult to densely pack such a plating substance into a long, narrow groove 14. As a result, a defect may occur, post processes may become more complicated, and higher manufacturing costs may incur. Therefore, there is a need to overcome these disadvantages and drawbacks.

SUMMARY

Technical objects of the invention will be enlightened further in Detailed Description below.

This section provides a general summary of the disclosure and is not a comprehensive disclosure of its full scope or all of its features.

According to one aspect of the present disclosure, a template for growing Group III-nitride includes: a growth substrate having a first plane, a second plane opposite to the first plane and a groove extending inwards the growth substrate from the first plane; an insert for heat dissipation placed and secured in the groove; and a nucleation layer formed on a partially removed portion of the first plane.

According to another aspect of the present disclosure, a Group III-nitride semiconductor light emitting device includes: a growth substrate having a first plane, a second plane opposite to the first plane and a groove extending inwards the growth substrate from the first plane; an insert for heat dissipation placed and secured in the groove; a nucleation layer formed on a partially removed portion of the first plane; a plurality of Group III-nitride semiconductor layers grown on the nucleation layer in the sequence of a first semiconductor layer having a first conductivity (e.g., n-type Group III-nitride semiconductor layer), an active layer for generating light by recombination of electrons and holes, and a second semiconductor layer having a second conductivity; a first electrode electrically connected to the second semiconductor layer; and a second electrode electrically connected to the first semiconductor layer.

According to another aspect of the present disclosure, a method of manufacturing a template for growing Group III-nitride semiconductor layers includes: forming, in a growth substrate having a first plane and a second plane opposite to the first plane, a groove extending inwards the growth substrate from the first plane; placing an insert for heat dissipation in the groove; and forming, on the first plane, a nucleation layer by a PVD (Physical Vapor Deposition) process.

According to another aspect of the present disclosure, a method of manufacturing a Group III-nitride semiconductor light emitting device includes: forming, in a growth substrate having a first plane and a second plane opposite to the first plane, a groove extending inwards the growth substrate from the first plane; placing an insert for heat dissipation in the groove; forming, on the first plane, a nucleation layer by a first deposition process; growing, on the nucleation layer, a plurality of Group III-nitride semiconductor layers in sequence by a second deposition process different from the first deposition process, the plurality of Group III-nitride semiconductor layers including a first semiconductor layer having a first conductivity, an active layer for generating light by recombination of electrons and holes, and a second semiconductor layer having a second conductivity different from the first conductivity; and electrically connecting the first electrode to the second semiconductor layer and the second electrode to the first semiconductor layer, respectively.

According to another aspect of the present disclosure, a method of manufacturing a Group III-nitride semiconductor light emitting device includes: growing a plurality of Group III-nitride semiconductor layers on a growth substrate having a first plane and a second plane opposite to the first plane; removing a portion of the plurality of Group III-nitride semiconductor layers and then a portion of the first plane of the growth substrate to form a groove that extend inwards the growth substrate; placing an insert for heat dissipation in the groove; and electrically connecting the plurality of Group III-nitride semiconductor layers and the insert for heat dissipation.

Advantages and benefits of the invention will be described further in Detailed Description below.

DETAILED DESCRIPTION

Figure 4:
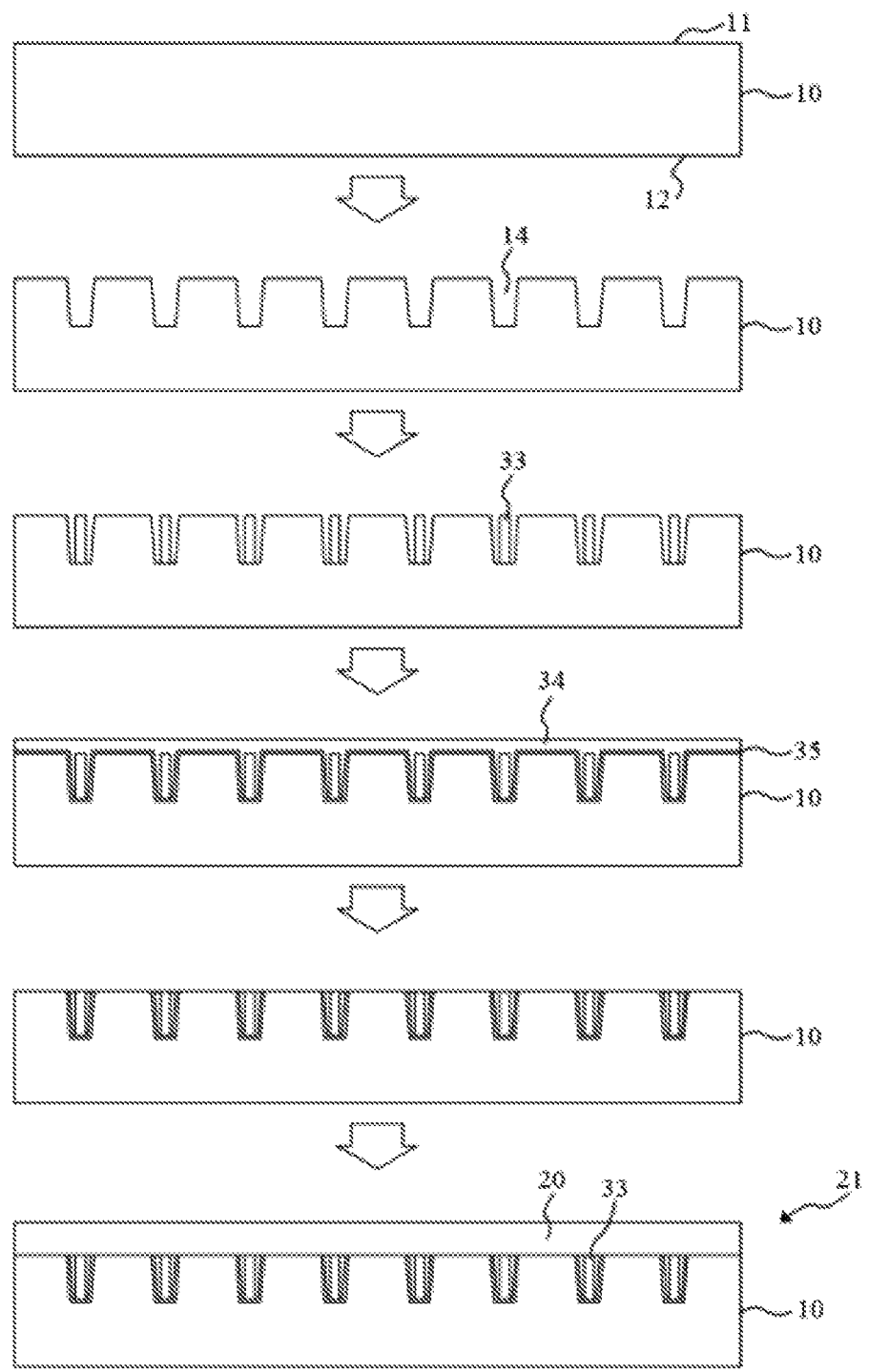
FIG. 4 shows an exemplary template for growing Group III-nitride semiconductor layers and an exemplary method of manufacturing the same according to one aspect of the present disclosure.

FIG. 4 shows an exemplary template for growing Group III-nitride semiconductor layers and an exemplary method of manufacturing the same according to one aspect of the present disclosure. The template 21 for growing Group III-nitride semiconductor layers includes a first substrate 10 as a growth substrate, which has a first plane 11, a second plane 12 opposite to the first plane 11, and grooves 14 extending inwards the growth substrate from the first plane 11; an insert 33 for heat dissipation placed and secured in each groove 14; and a nucleation layer 20 formed on the first plane 11.

The first substrate 10 as a growth substrate is made of a material that allows Group III-nitride semiconductor layers to grow on it. Examples of the material may include $Al_2O_3$, SiC, GaN, AlN, and ZnO, and among them, $Al_2O_3$, which is light transmitting, is a typical commercially available material.

The grooves 14 can be formed by laser ablation, chemical wet etching, dry etching, sand blasting, or ultra sound drilling. There are no particular limitations to the shape of the groove 14. For example, the groove can be a circle, preferably having a radius between 500 nm and 500 µm. If the radius is smaller than 500 nm, it is difficult to place the insert 33 in the groove. If the radius is larger than 500 µm, cracking is more likely to occur during the manufacturing process. It is sufficient that each semiconductor device has at least one groove 14. In particular, when a groove serves as an electrical pass, the number of grooves preferably equals to or higher than the number of electrodes present in the semiconductor light emitting device. Spacing between the grooves 14 and depth of each groove may vary depending on the type of a device to be produced on the first substrate 10, and these grooves 14 are designed to run from the first plane 11 to the second plane 12, passing through the first substrate 10.

The insert 33 serves as a heat dissipation pass. If the insert 33 is designed to eventually run from the first plane 11 to the second plane 12 of the first substrate 10, it can also serve as an electrical pass. Accordingly, the insert 33 can function as the heat dissipation pass and/or the electrical pass.

Figure 1:
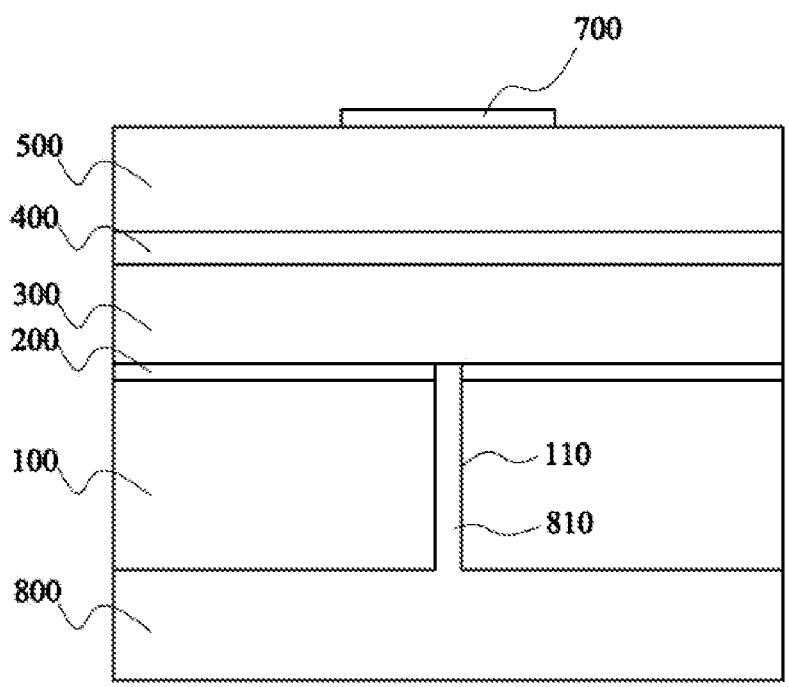
FIG. 1 and FIG. 2 show an exemplary semiconductor light emitting device described in Japanese Patent Laid-Open Publication No. H08-083929.
Figure 2:
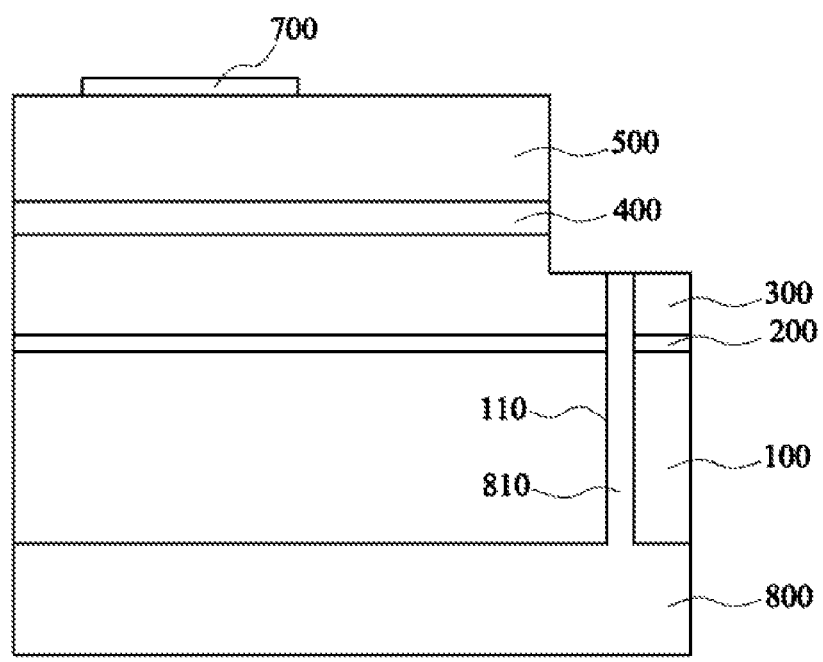
Figure 3:
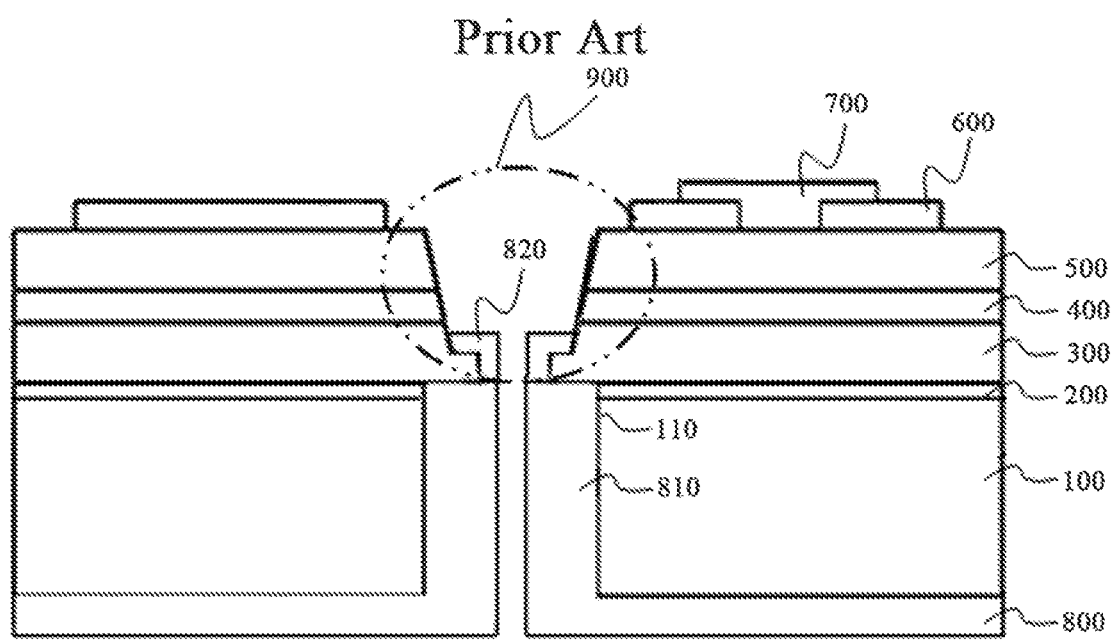
FIG. 3 shows an exemplary semiconductor light emitting device described in U.S. Patent Application Publication No. 2008-0315240.

In the examples shown in FIGS. 1 to 3, although the electrical connection 810 is usually formed by plating, the metal itself used for plating thermally expands, and it is difficult to obtain dense packing of such a plating substance into a long, narrow groove 14. As a result, a defect may occur, post processes may become more complicated, and higher manufacturing costs may incur. Therefore, there is a need to overcome these disadvantages and drawbacks. By way of example, in case of electroplating, a plating substance (e.g., copper) is placed at the anode (+) and a target to be plated is placed at the cathode (−). The plating substance is then reduced at the target and the electrical connection 810 is formed. This process, however, has limitations for obtaining a denser electrical connection 810.

The present disclosure resolves these disadvantages and drawbacks by making the insert 33 into a rod or wire form substance. In fact, µm-scale wires (e.g., Nickel wire, Cobalt wire, Iron wire) are already commercially available (this can be easily found through Google's search). The wire is cut to a desired depth of the groove 14 and a rod shape insert 33 is then obtained. Since nickel, cobalt, and iron are ferromagnetic metal substances, the rod shape insert 33 prepared from those substances can be placed in the groove 14 by keeping the insert 33 on the first plane 11 and moving a magnet (not shown) along the second plane 12. This magnet-assisted technique of placing the insert 33 in the groove 14 is disclosed in U.S. Pat. No. 3,736,651, for example. In case of employing a magnet to place the insert 33 into the groove 14, the insert 33 should preferably be made of a ferromagnetic alloy containing ferromagnetic substances such as Ni, Co and Fe, or any one of them. Unlike the electrical connection 81 formed by plating, this dense, rod shape insert 33 can provide enhanced thermal conductivity and electrical conductivity while inhibiting thermal expansion. Therefore, cracking in semiconductor devices, and separation between a semiconductor device and a supporting substrate (i.e. broken bonding) can be overcome. All or part of the rod shape insert 33 can be made of ferromagnetic substances, and optionally, its surface can be coated with a paramagnetic substance such as Ag, Au or Cu.

Instead of placing the solid rod shape insert 33 directly into the groove 14 as above, it is also possible to put a continuous liquid-phase substance into the groove 14 to obtain the insert 33. This can be done by wire bonding, i.e., using a wire bonder, which is used for electrically connecting the first electrode 700 shown in FIGS. 1 to 3 to a PCB. As wire bonding and wire bonders are broadly used in the semiconductor industry, it will not be explained in further detail here. It suffices to say that wire bonding makes it possible to put continuous liquid-phase wire shape inserts 33 into densely arranged grooves 14 at lower costs. This type of the insert 33 can be made of a material suitable for wire bonding, including Au, Au alloys, Ag, Ag alloys, Cu, Cu alloys, Al or Al alloys, for example.

Alternatively, metal powders and/or alloy powders featuring high reflectivity and/or high heat dissipation, ceramic powders featuring high heat dissipation (e.g., AlN, BN, SiC, AlSiC), or any mixture of these and an organic binder may be put into the groove 14 and undergo heat treatment in order to form the insert 33. A dispenser, which is generally used for coating an encapsulating material, can be handy to put those materials into the groove 14. In doing so, the insert 33 can be secured within the groove 14 without the need of a fixation substance 34, and post processes for polishing the first plane 11 may be omitted. Examples of substances with high reflectivity and high heat dissipation include metals including Al, Ag, Rh, Pt, Pd, Au, Cr, Ni, Mo, Ti, Cu, or any alloy containing at least one of them.

When the insert 33 is formed independently of plating or PVD, the insert 33 needs to be fixed or filled within the groove 14. The fixation substance 34 is therefore used either before or after the insert 33 is placed in the groove 14. That is, the fixation substance 34 is coated (e.g., spin coated) and then undergoes a drying operation or heat treatment, such that the insert 33 may be placed and fixed within the groove 14. There are no particular limitations to the fixation substance 34 as far as it can withstand high temperature environment (e.g., 1000° C. or higher) where Group III-nitride semiconductor layers are grown. Suitable examples thereof include organic low-k dielectrics, such as, SOC (Spin-on-Glass), BCB (benzocyclobutene), PR (photoresist), Epoxy-based polymers, silicone, parylene, SU-8 and so on. Besides these organic low-k dielectrics, a paste containing high thermal conductivity metals, alloys or ceramic powder particles in a viscous liquid-phase substance for effective heat dissipation can also be used as the fixation substance.

In addition, before the insert 33 or the fixation substance 34 such as SOG is placed in the groove 14, a high reflectivity and/or high thermal conductivity substance 35 such as Al, Ag, Rh, DBR (distributed Bragg reflector), or ODR (omni directional reflector) can be provided into the groove 14 and then subject to heat treatment such that the insert 33 is secured within the groove 14. By introducing the high reflectivity and/or high thermal conductivity substance 35, the insert 33 and the fixation substance 34 will absorb less light, which in turn gives more choices of substances of the insert 33 and of the fixation substance 34 and makes it possible to reduce optical losses.

Alternatively, the fixation substance 34 can be provided into the groove 14 before the insert 33 is placed in the groove 14. This approach is advantageous in that the insert 33 can be placed more easily as the rough surface of the groove 14 obtained by laser drilling for example is covered with the fixation substance 34. Once the insert 33 is placed, it undergoes drying or heat treatment and the fixation substance 34 together with the insert 33 are secured within the groove 14. While those exemplary fixation substances 34 described above can also be used in this case, a bonding metal substance can be added to the fixation substance coating in order to facilitate fixing and wire bonding of the insert 33 before it undergoes drying or (optionally) heat treatment. Alternatively, the bonding metal substance may be deposited directly. After the fixation substance 34 is provided into the groove 14 and before the insert 33 is placed in the groove 14, the fixation substance portion 34 on the first plane 11 can be removed beforehand, while leaving the fixation substance portion 34 formed inside the groove 14 as is. By doing so, the bonding metal substance and the insert 33 can be more firmly secured through the heat treatment carried out on the insert 33 which is placed in the groove. Similarly, when the fixation substance 34 is made of ceramic powder, it can be provided into the groove 14 before the insert is placed therein. The processes of depositing the bonding metal substance and/or high reflectivity substance 35, providing the fixation substance 34, and placing the insert 33 can be carried out at different orders. For instance, depositing the bonding metal substance and/or high reflectivity substance 35 can be performed first, followed by placing the insert 33 and then providing the fixation substance 34.

The bonding substance can be chosen from low melting point (e.g., 300° C. or lower) metals (Sn, In, Zn and Ga), and alloys or pastes containing at least one of them. The bonding substance can be produced by preparing a uniform viscous mixture of a powder of fine particles (5 μm or smaller) of low melting point metal and/or high melting point metal and/or an organic binder, dispensing the mixture, and carrying out heat treatment on the mixture.

By providing the fixation substance 34 and/or the high reflectivity substance 35 into the groove 14 beforehand, the size of the groove 14 can be controlled independently of drilling. As such, placing the insert 33 of the μm scale can be done more easily with high precision. In other words, the size of the groove 14 can be controlled in a precise manner by an operation such as spin coating, deposition or the like, independently of drilling.

As yet another alternative, the rod shape insert 33 and the fixation substance 34 can be mixed together and coated on the first substrate 10, and a magnet is used to lead the insert 33 in the groove 14 such that the insert 33 may be kept from being detached from the first plane 11 and the groove 14. For instance, this is useful for preventing the detachment of the insert 33 from the first plane 11 or the groove 14 due to a spinning motion as the fixation substance 34 is coated by spin coating after the insert 33 is placed in the groove 14.

Once the insert 33 and the fixation substance 34 are placed and secured within the groove 14, if needed and desirable, a portion of the first substrate 10 on the first plane 11 can be removed. As a result of the removal, the fixation substance 34 located on the first plane 11 is removed, and the insert 33 and the groove 14 can have equal heights. This removal operation can be done by polishing, and the insert 33 can be exposed as a portion of the first substrate 10 is removed.

Lastly, a seed layer or nucleation layer 20 for growing a Group III-nitride semiconductor layer is formed on the first plane 11 of the first substrate 10 where the inserts 33 are exposed. The nucleation layer 20 is preferably grown by physical vapor deposition. Sputtering or PLD (Pulsed Laser Deposition) may optionally be used. The nucleation layer 20 can be made of a Group III-nitride semiconductor such as AlN, AlGaN, GaN, ANInN, InGaN or AlGaInN, and have a different composition depending on a Group III-nitride semiconductor light emitting device to be grown thereon. In case of a UVC-emitting Group III-nitride semiconductor light emitting device, the nucleation layer 20 is preferably made of an Al-rich AlGaN or AlN with a bandgap energy that does not absorb those UVC lights. Preferably, the nucleation layer 20 has a thickness of less than 100 nm. If the thickness is 100 nm or greater, a strong stress is generated and the template for growing is bowed, making it difficult to obtain a Group III-nitride semiconductor layer having a uniform composition. When the nucleation layer 20 is grown by physical vapor deposition instead of by MOCVD, its grain defects can be substantially reduced. For example, the nucleation layer 20 can be obtained by forming AlN or AlNO into a film by physical vapor deposition at a temperature of 500° C. or lower, under nitrogen atmosphere that contains a small amount of oxygen. The presence of a small amount of oxygen makes grains of the AlN or AlNO substance layer even smaller and produces higher quality Group III-nitride semiconductor thin films.

If needed, before or after forming the nucleation layer 20, a growth inhibition layer (e.g., $SiO_2$, not shown) may be formed at a location corresponding to the insert 33, such that no Group III-nitride semiconductor layer is grown at that location.

Figure 5:
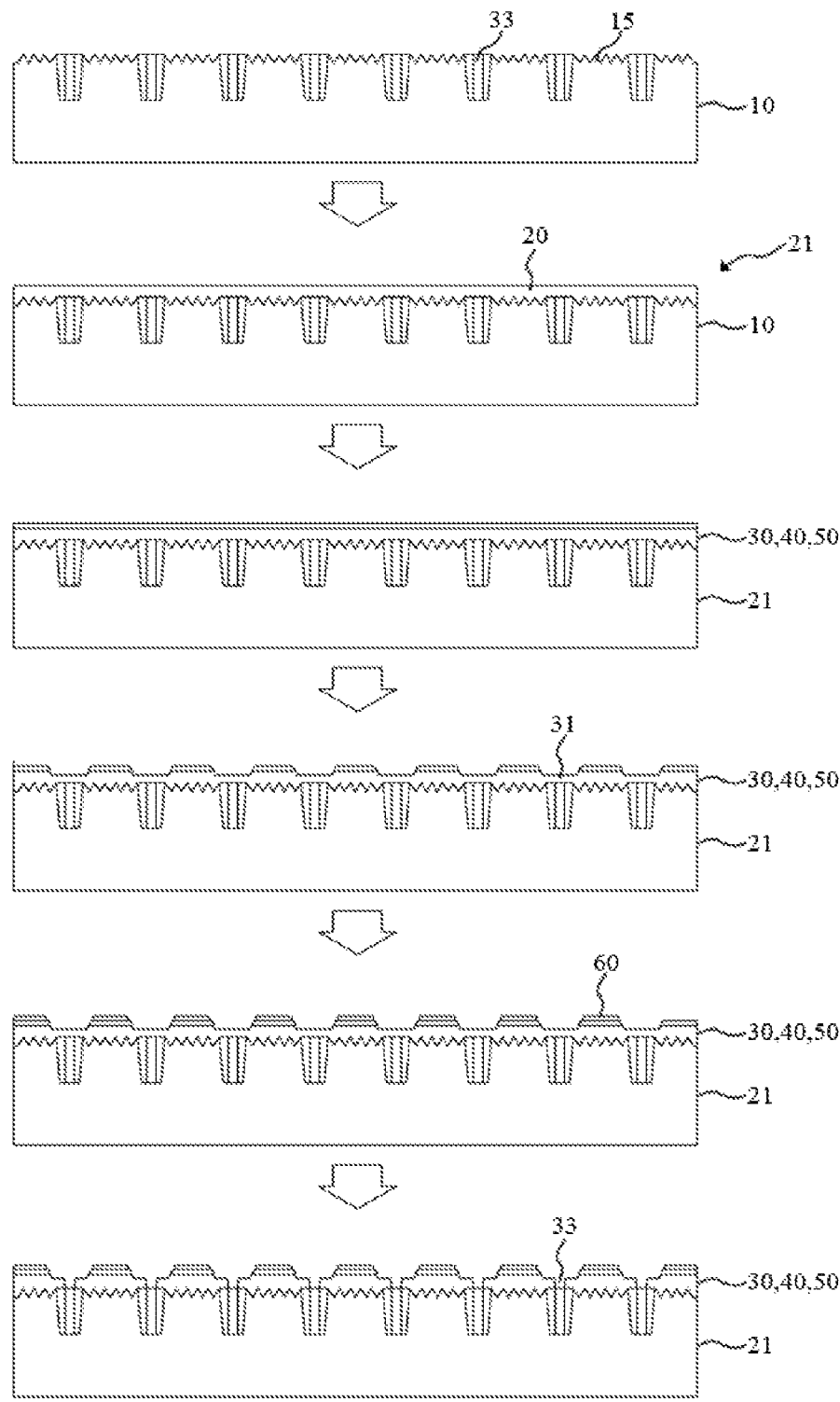
FIG. 5 and FIG. 6 show an exemplary Group III-nitride semiconductor light emitting device and an exemplary method of manufacturing the same according to one aspect of the present disclosure.
Figure 6:
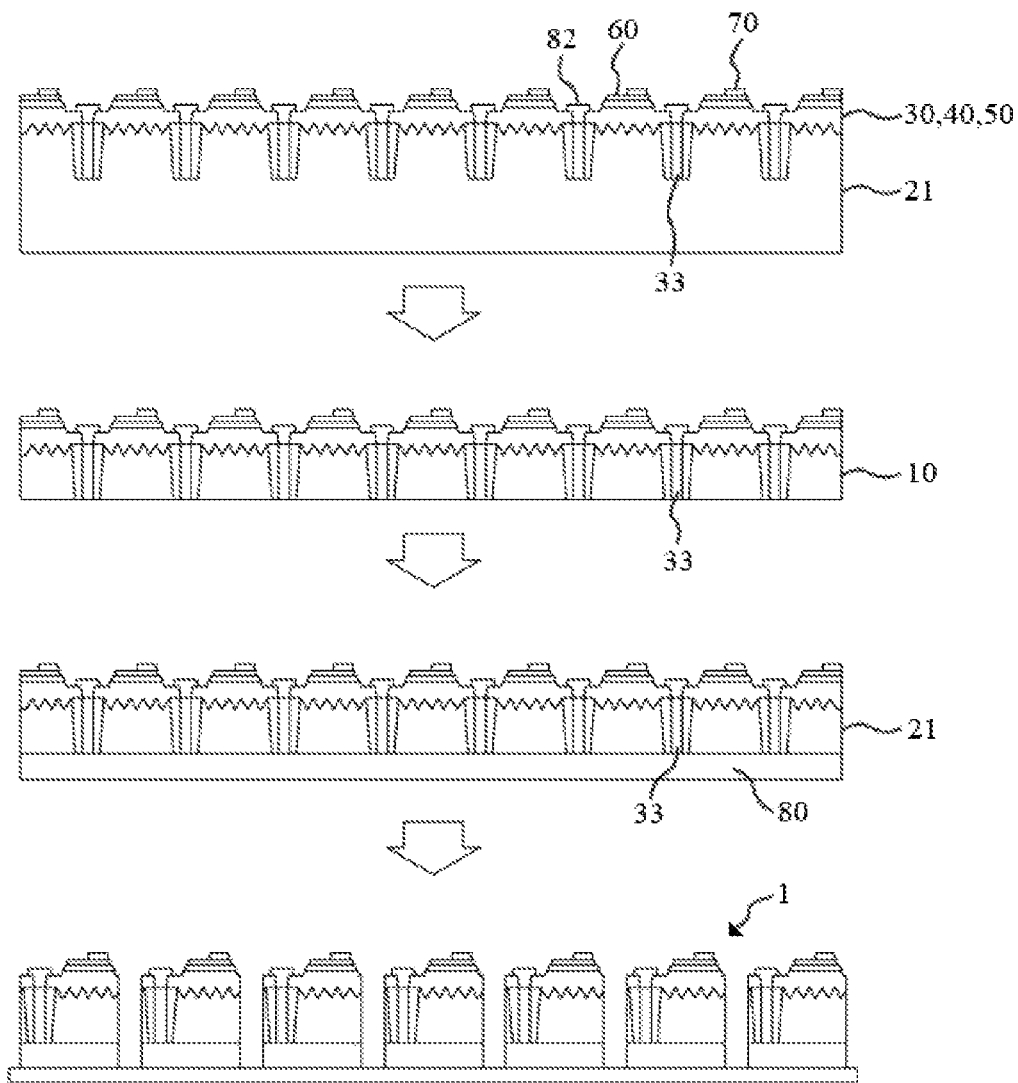

FIG. 5 and FIG. 6 show an exemplary Group III-nitride semiconductor light emitting device and an exemplary method of manufacturing the same according to one aspect of the present disclosure. The Group III-nitride semiconductor light emitting device includes a template 21 for growing Group III-nitride semiconductor layers thereon; a plurality of Group III-nitride semiconductor layers grown on a nucleation layer 20 of the template 21 in the sequence of a first semiconductor layer 30 having a first conductivity (e.g., n-type Group III-nitride semiconductor layer), an active layer 40 for generating light by recombination of electrons and holes (e.g., a multi-quantum well structure) and a second semiconductor layer 50 having a second conductivity (e.g., a p-type Group III-nitride semiconductor layer); a first electrode 70 electrically connected to the second semiconductor layer 50; and a second electrode 80 electrically connected to the first semiconductor layer 30. Here, the active layer 40 is made of a Group III-nitride semiconductor (Al(x)Ga(y)In(1-x-y)N (0<x≤1, 0<y≤1, 0<x+y≤1)) and can generate lights ranging from green light to UV by varying its composition.

The plurality of semiconductor layers 30, 40 and 50 is grown by a different process from physical vapor deposition used for forming the nucleation layer 20. For instance, chemical vapor deposition such as MOCVD, or HVPE can be used. Also, another physical vapor deposition such as MBE can be used. In general, commercially available Group III-nitride semiconductor light emitting devices (e.g., light emitting diodes) are manufactured by MOCVD.

In case of manufacturing a light emitting diode, the template 21 for growing Group III-nitride semiconductor layers preferably has light scattering protrusions 15 on the first plane 11 of the first substrate 10. The protrusions 15 may have diverse shapes such as hemispheres, triangular pyramids, quadrangular pyramids, stripes or the like. Methods for forming these protrusions 15 are described in U.S. Pat. Nos. 6,091,085 and 7,759,140 and U.S. Patent Application Publication No. 2008-0303042. Here, the protrusions 15 are formed, the nucleation layer 20 is formed by PVD, and then the template 21 is transferred to equipment for growing the plurality of semiconductor layers 30, 40 and 50 (e.g., MOCVD equipment) such that the semiconductor layers 30, 40 and 50 can grow on the template 21.

Next, part of the plurality of semiconductor layers 30, 40 and 50 is etched to form an exposed surface 31 on the first semiconductor layer 30. Preferably, a current spreading electrode 60 (e.g., ITO, ZnO, Ni/Au) is formed on the second semiconductor layer 50, and an additional etching process is carried out to expose the insert 33. Then, the first electrode 70 is formed on the current spreading electrode 60. Preferably, for stable electrical connection to the first semiconductor layer 30, an ohmic electrode 82 is provided at a location where the insert 33 is placed, and the ohmic electrode 82 can be formed during the process of forming the first electrode 70. A person skilled in the art shall understand that the processes of forming the exposed surfaces 31, forming the current spreading electrode 60, exposing the insert 33, and forming the first electrode 70 can be performed in any order.

Further, the insert 33 is exposed by polishing the second plane 12 of the first substrate 10, and the second electrode 80 is formed. The second electrode 80 is electrically connected to the first semiconductor layer 30 through the insert 33 (via the ohmic electrode 82). The second electrode 80 includes a low melting point metal (e.g., In, Sn, Zn, Ga) which can be used for metal bonding.

Finally, individual chips are obtained by processes such as sawing, laser scribing & breaking, and so on. In the present disclosure, Group III—nitride semiconductor light emitting devices refer not only to ones before being split into chips but to those individual chips after being split.

Figure 7:
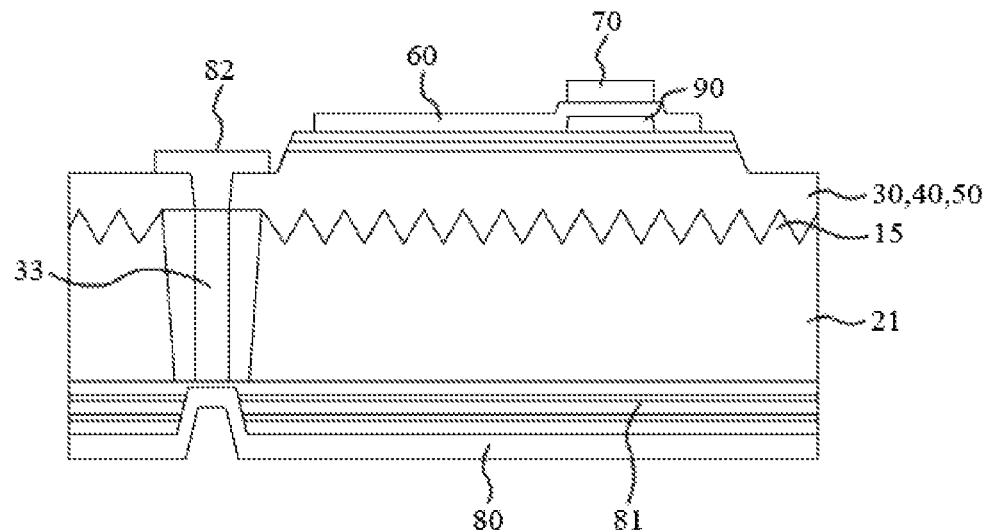
FIG. 7 shows another exemplary Group III-nitride semiconductor light emitting device according to one aspect of the present disclosure.

FIG. 7 shows another exemplary Group III-nitride semiconductor light emitting device according to one aspect of the present disclosure. The Group III-nitride semiconductor light emitting device includes a current blocking layer 90 (e.g., $SiO_2$) arranged below the first electrode 70, with the current spreading electrode 60 being interposed between the current blocking layer 90 and the first electrode 70; and a reflective layer 81 (e.g., DBR (Distributed Bragg Reflector) arranged between the second electrode 80 and the template 21. The reflective layer 81 is removed in a region where the second electrode 80 meets the insert 33. Other components with reference numerals that are already described above will not be discussed here again. The current blocking layer 90 serves to prevent light absorption by the first electrode 90, and the reflective layer 81 serves to increase the optical extraction efficiency to the outside of the device.

Figure 8:
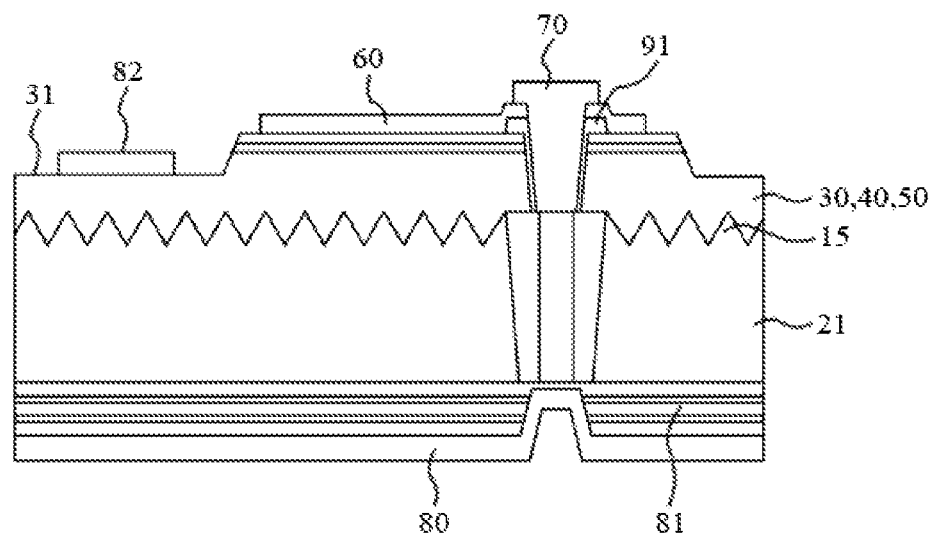
FIG. 8 shows another exemplary Group III-nitride semiconductor light emitting device according to one aspect of the present disclosure.

FIG. 8 shows another exemplary Group III-nitride semiconductor light emitting device according to one aspect of the present disclosure. The Group III-nitride semiconductor light emitting device includes the insert 33 at a location where the first electrode 70 is. The first electrode 70 and the current spreading electrode 60 are insulated from the plurality of semiconductor layers 30, 40 and 50 by an insulation layer 91 (e.g., $SiO_2$). The first electrode 70 is electrically connected to the second semiconductor layer 50 through the current spreading electrode 60. The ohmic electrode 82 is formed on the exposed surface 31 of the first semiconductor layer 30 and electrically connected to the first semiconductor layer 30. It serves as the second electrode. In the previous exemplary embodiments, an electrode 83 served as the second electrode and was connected to the first semiconductor layer 30. In this embodiment, the electrode 83 has the same location, but it is electrically connected to the first electrode 70 through the insert 33, forming a part of the first electrode 70 as a back-side electrode on the second plane 12 side of the template 21. Other components with reference numerals that are already described above will not be discussed here again.

Figure 9:
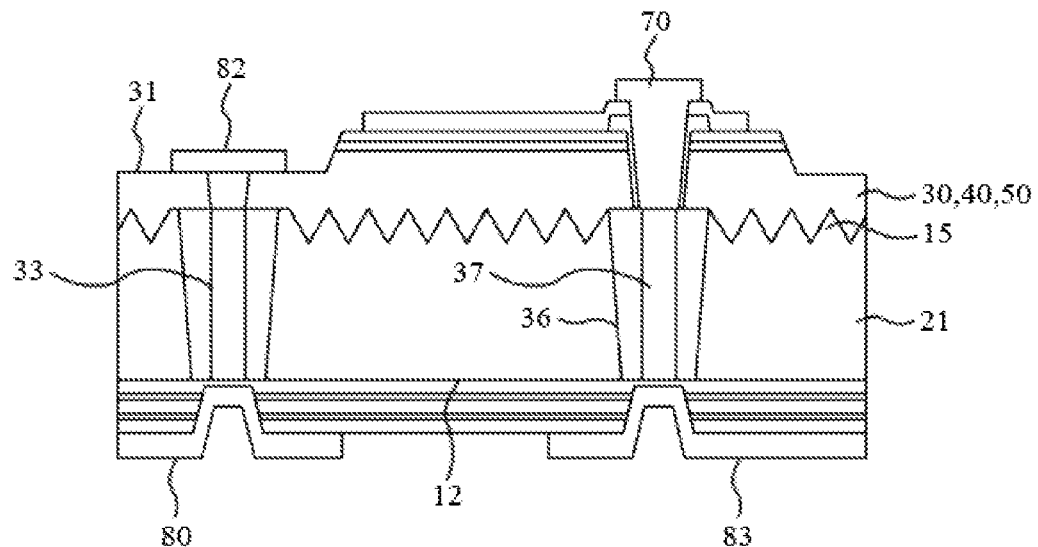
FIG. 9 shows another exemplary Group III-nitride semiconductor light emitting device according to one aspect of the present disclosure.

FIG. 9 shows another exemplary Group III-nitride semiconductor light emitting device according to one aspect of the present disclosure. The Group III-nitride semiconductor light emitting device has an additional groove 36 in the first substrate 10, and includes an additional insert 37 that is placed and secured in the additional groove 36 and further, a back-side electrode 83 formed on the second plane 12 side of the first substrate 10, with the back-side electrode 83 being electrically connected to the first electrode 70 through the additional insert 37. The second electrode 80 is formed on the second plane 12 side of the first substrate 10, and electrically connected to the first semiconductor layer 30 through the insert 33. As the second electrode 80 and the back-side electrode 83 are connected to an external power supply, there is no need for wire bonding. Therefore, loss in the optical efficiency on top of the device can be reduced.

Figure 10:
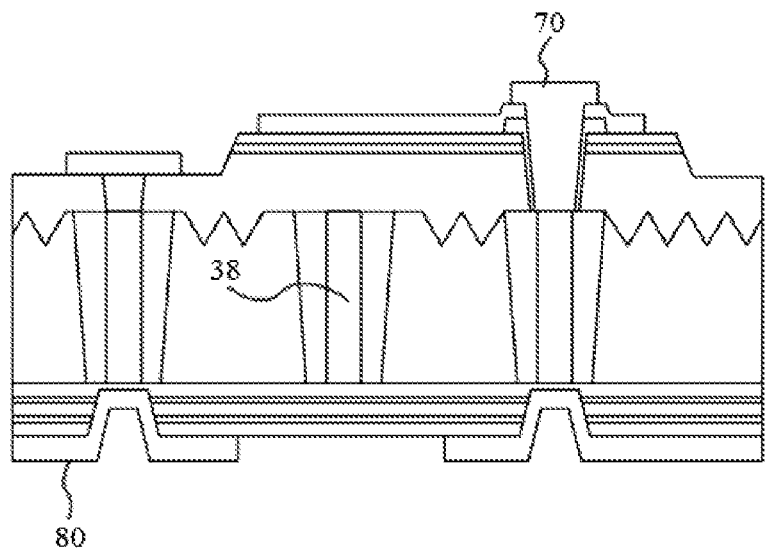
FIG. 10 shows another exemplary Group III-nitride semiconductor light emitting device according to one aspect of the present disclosure.

FIG. 10 shows another exemplary Group III-nitride semiconductor light emitting device according to one aspect of the present disclosure. The Group III-nitride semiconductor light emitting device includes an insert 38 that is not electrically connected to the first and second electrodes 70 and 80. The insert 38 does not serve as an electrical pass, serving only as a heat dissipation pass.

Figure 11:
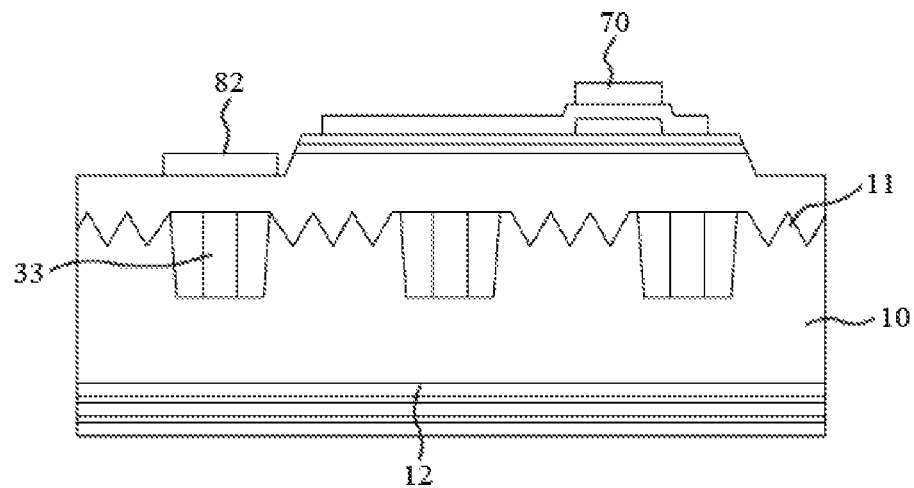
FIG. 11 shows another exemplary Group III-nitride semiconductor light emitting device according to one aspect of the present disclosure.

FIG. 11 shows another exemplary Group III-nitride semiconductor light emitting device according to one aspect of the present disclosure. The Group III-nitride semiconductor light emitting device includes an insert 33 designed to extend from the first plane 11 of the first substrate 10 up to a point before reaching the second plane 12 of the first substrate 10. The first electrode 70 and the ohmic electrode 82 are directly connected to an external power supply, and the insert 33 serves as a heat dissipation pass.

Figure 12:
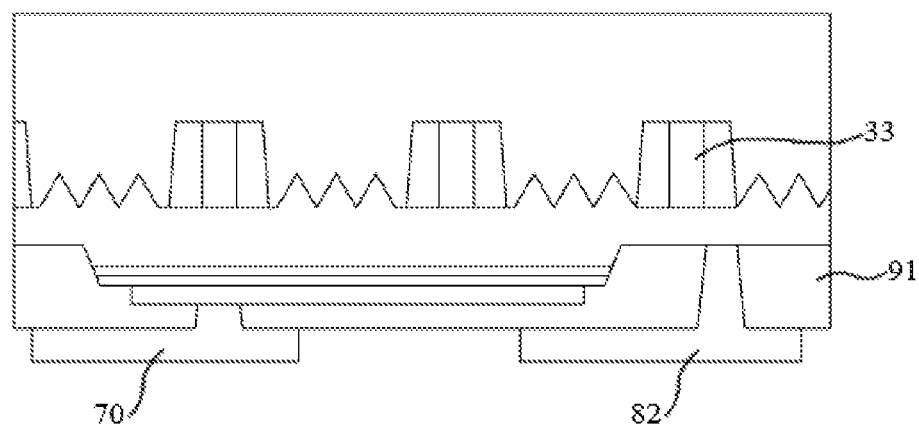
FIG. 12 shows another exemplary Group III-nitride semiconductor light emitting device according to one aspect of the present disclosure.

FIG. 12 shows another exemplary Group III-nitride semiconductor light emitting device according to one aspect of the present disclosure. The Group III-nitride semiconductor light emitting device includes the same type of an insert 33 as the insert 33 illustrated in FIG. 11, and an insulation layer 91 (e.g., $SiO_2$) provided to put the first electrode 70 and the ohmic electrode 82 at equal heights. Moreover, the first electrode 70 and the ohmic electrode 82 are connected to an external power supply, being flip chip bonded instead of being wire bonded. Such chips thus obtained are called flip chips.

Figure 13:
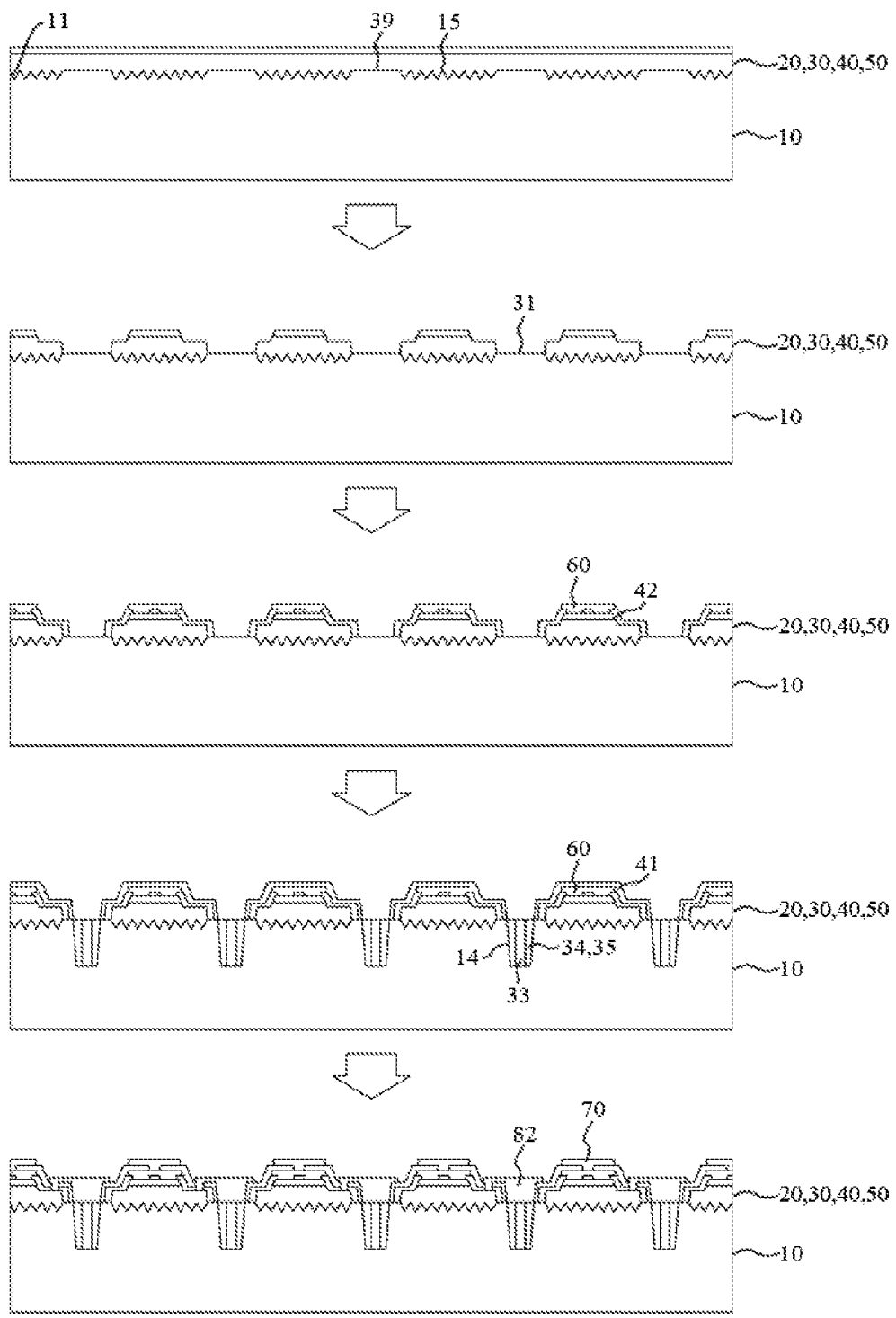
FIG. 13 shows another exemplary method of manufacturing a Group III-nitride semiconductor light emitting device according to one aspect of the present disclosure.

FIG. 13 shows another exemplary method of manufacturing a Group III-nitride semiconductor light emitting device according to one aspect of the present disclosure. Unlike the embodiment illustrated in FIG. 4, the insert 33 is not placed beforehand, and the plurality of semiconductor layers 30, 40 and 50 is grown on the first plane 11 of the substrate 10. Preferably, a nucleation layer 20 may be present, and the nucleation layer 20 can be formed by the same manner as the semiconductor layers 30, 40 and 50, or by a different manner as in this embodiment if necessary. The first plane 11, excluding a region 39 where the insert 33 is to be formed, has protrusions 15 for scattering light. This can facilitate the formation of the groove 14 later.

Next, an etching process is carried out to form the exposed surface 31 and to expose the region 39 where the insert 33 is placed. It does not really matter whether the exposed surface 31 should be formed first, or the region 39 where the insert 33 is placed should be exposed (this can be done as a part of a chip isolation process) first, but the former is usually carried out first. Preferably, the region 39 has a width greater than the size of the insert 33 as well as a margin for preventing damages to the plurality of semiconductor layers 30, 40 and 50 during the process of forming the groove 14.

Further, a light transmitting or reflective current spreading electrode 60 (e.g., ITO, ZnO, Ni/Au or Ag reflective layer, Al reflective layer or the like) is formed. Preferably, a passivation layer 41 (e.g., $SiO_2$, $TiO_2$, $SiN_x$, DBR) for protecting the lateral and top faces of the plurality of semiconductor layers 30, 40 and 50 is formed prior to the formation of the current spreading electrode 60. As illustrated in FIG. 7, the current blocking layer 90 can also be formed during this process. In other words, the current blocking layer 90 and the passivation layer 41 are insulation layers of the same nature.

If needed and desired, a protecting layer 42 is formed with the same material as the passivation layer 41, for covering the current spreading electrode 60.

Next, as illustrated in FIG. 4, the groove 14 is formed in the region 39, and the insert 33, the fixation substance 34 and the high reflectivity substance 35 are formed in any suitable order and in any proper combination.

After that, the first electrode 70 and the ohmic electrode 82 are formed. If the passivation layer 41 and the protecting layer 42 are present, they are first removed to the extent necessary to electrically connect the first and ohmic electrodes 70 and 82 to the plurality of semiconductor layers 30, 40 and 50.

Any following processes are the same as illustrated in FIG. 6. Obviously, the Group III-nitride semiconductor device can be manufactured as shown in FIGS. 7 to 9. Alternatively, the method illustrated in FIG. 5 can be combined with the method illustrated in FIG. 13.

Figure 14:
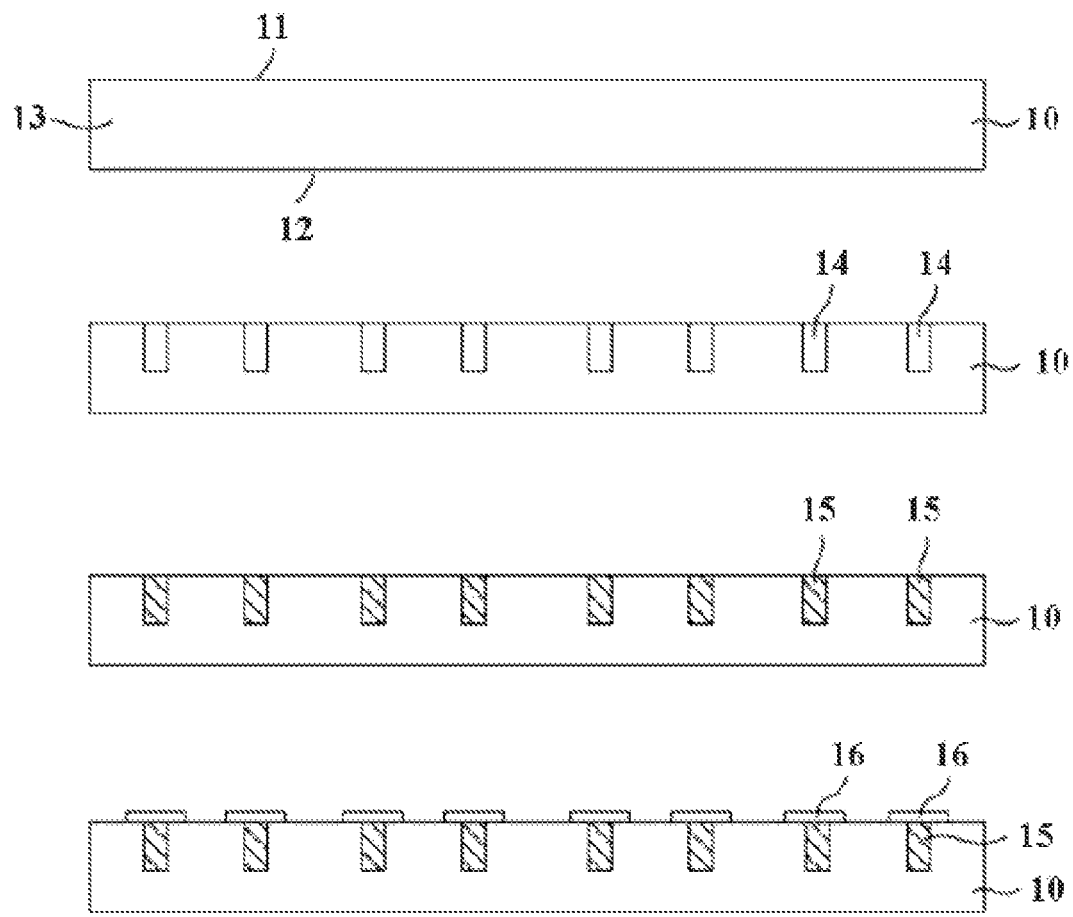
FIG. 14 and FIG. 15 show an exemplary method of manufacturing a supporting substrate for a semiconductor device according to one aspect of the present disclosure.
Figure 15:
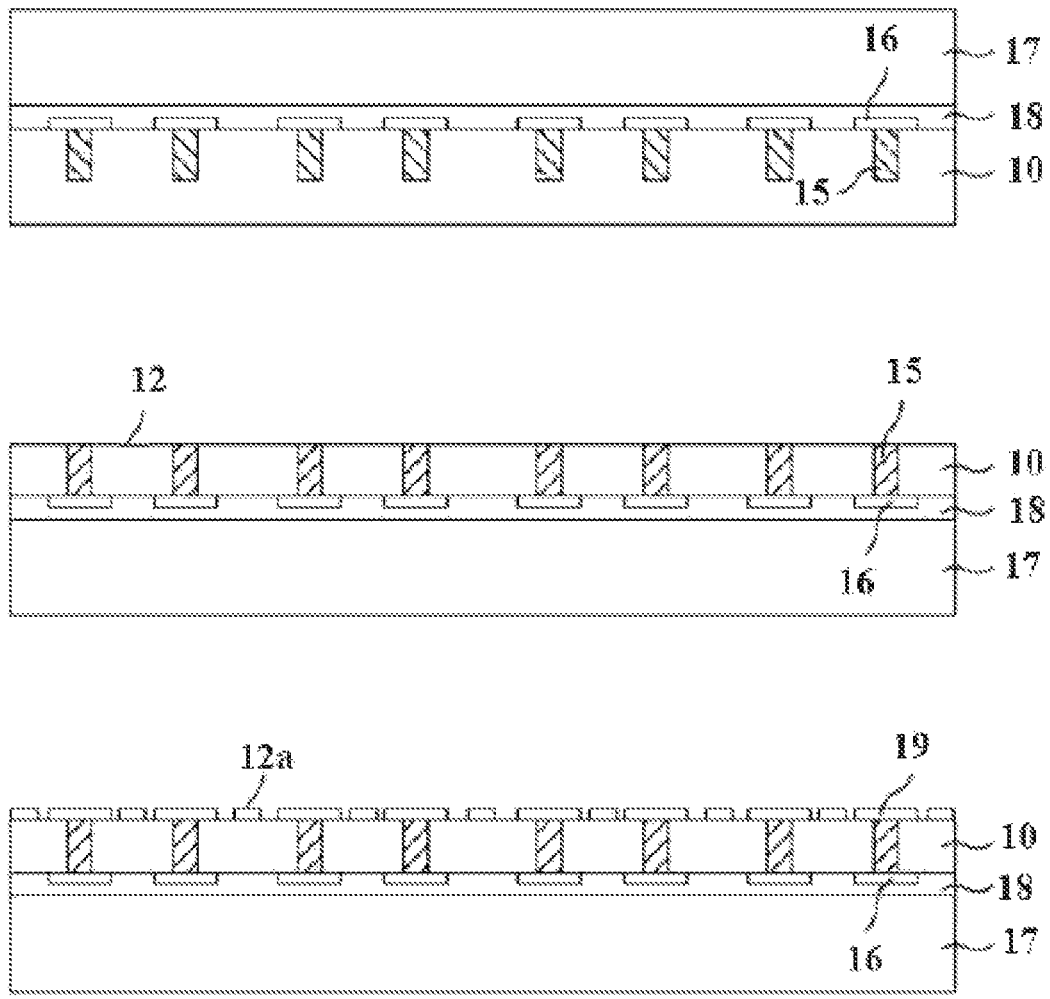

FIG. 14 and FIG. 15 show an exemplary method of manufacturing a supporting substrate for a semiconductor device according to one aspect of the present disclosure. As shown in FIG. 14, a first substrate 10 is prepared. The first substrate 10 has a first plane 11, a second plane 12, and lateral planes 13 connecting the first plane 11 and the second plane 12. Grooves 14 are then formed in the first plane 11. There are no particular limitations to the shape of the grooves 14. The grooves 14 can have a circular, polygonal, slit or trench shape, i.e. an elongated extended shape or an independent recess shape. A conductive part 15 is formed in the groove 14. Preferably, a conductive pad 16 is formed on the conductive part 15. The conductive part 15 and the conductive pad 16 can be formed in separate processes or in one process.

Referring next to FIG. 15, a second substrate 17 is bonded to the first substrate 10 with a bonding layer 18. The thickness of the first substrate 10 is reduced by polishing the second plane 12. Preferably, a conductive pad 19 is formed on a conductive part 15. If the second substrate 17 has adhesive properties that enable the second substrate 17 to directly attach to the first substrate 10, the bonding layer 18 can be omitted. If needed, a reflective or insulation layer 12a can be formed on the first substrate 10, before or after the conductive pad 19 is formed thereon.

Figure 16:
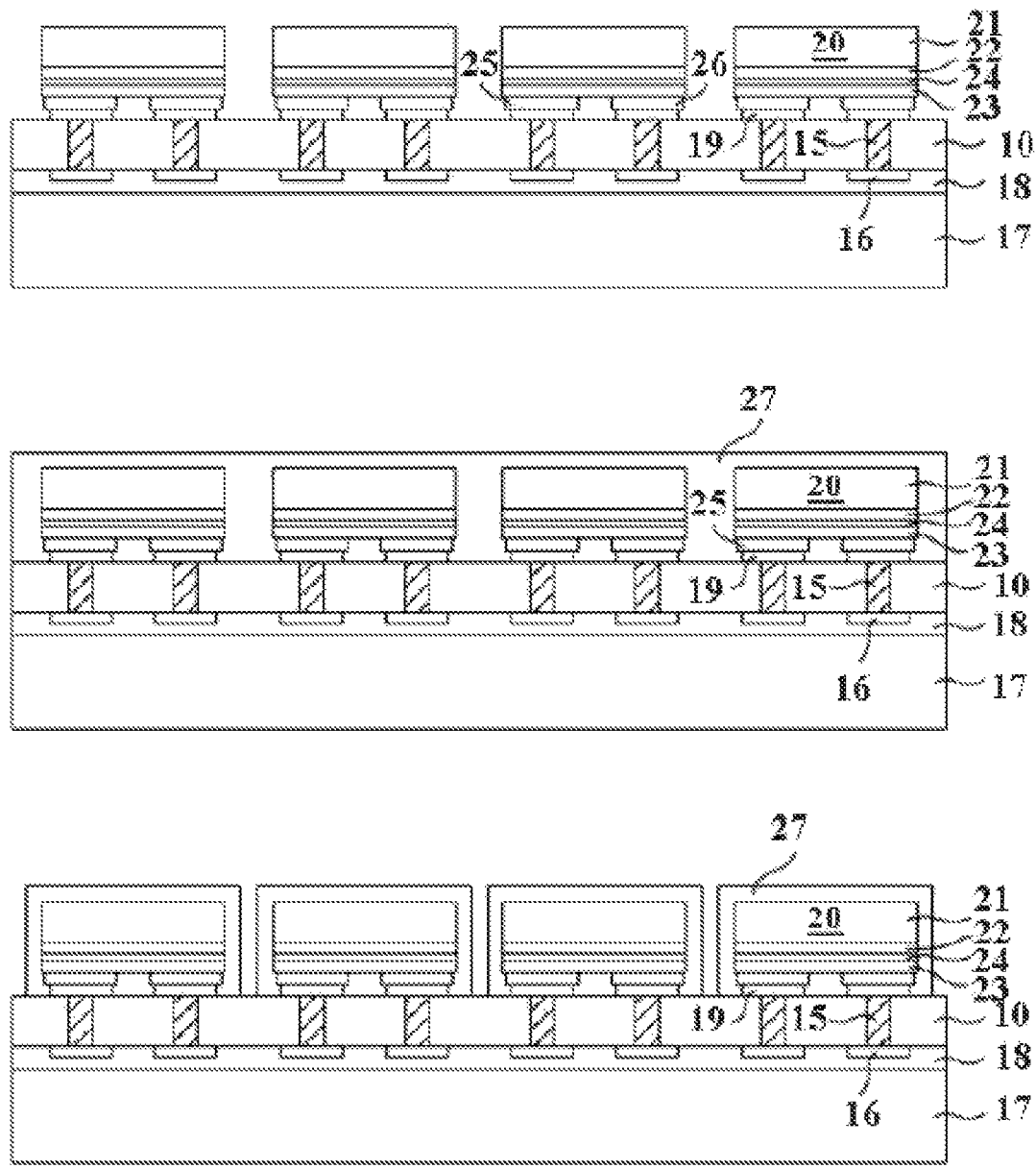
FIG. 16 and FIG. 17 show an exemplary method of manufacturing a semiconductor device according to one aspect of the present disclosure.
Figure 17:
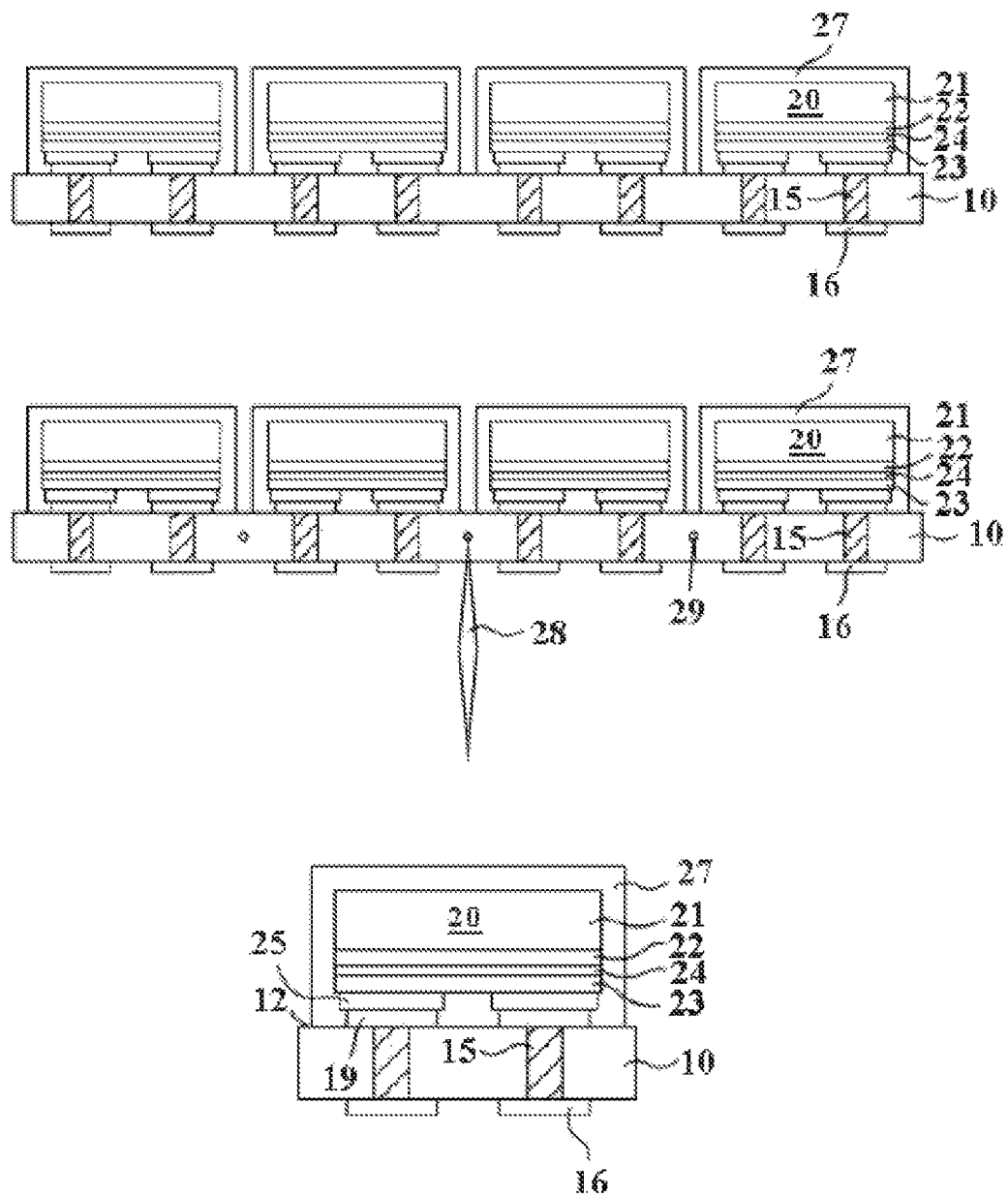

FIG. 16 and FIG. 17 show an exemplary method of manufacturing a semiconductor device such as a semiconductor light emitting device, according to one aspect of the present disclosure. As shown in FIG. 16, a semiconductor light emitting device chip 20 is fixed onto the first substrate 10. The semiconductor light emitting device chip 20 includes a growth substrate 21 (e.g., $Al_2O_3$), a first semiconductor layer 22 (e.g., n-type GaN) having a first conductivity, a second semiconductor layer 23 (e.g., p-type GaN) having a second conductivity different from the first conductivity, an active layer 24 (e.g., InGaN/(In)(Al)GaN multi-quantum well structure) for generating light by recombination of electrons and holes, and a first and a second electrode 25 and 26 electrically connected to the first and second semiconductor layers 22 and 23, respectively. There are no particular limitations to the semiconductor light emitting device chip 20 as far as it has a flip chip form. The first and second electrodes 25 and 26 are fixed onto their corresponding conductive parts 15. The conductive part 15 serves as an electrical pass as well as a thermal pass. Preferably, an encapsulating material 27 is formed to cover the semiconductor light emitting device chip 20. The encapsulating material 27 can include phosphors and/or light scattering materials. Preferably, a portion of the encapsulating material 27 is removed or cut off to expose its lateral faces. This is done to facilitate a cutting process later (to be described) or to shape the encapsulating material 27 following the semiconductor light emitting device chip 20. Such a removing process of the encapsulating material 27 portion involves cutting, sawing or the like. Alternatively, instead of covering the semiconductor light emitting device chips 20 with the encapsulating material 27, a frame shaped in the cut-off encapsulating material 27 may be placed on the first substrate 10 and a desired encapsulating material 27 may be formed accordingly in the frame. While there are conductive parts 15 for the respective electrodes 25 and 26 in this embodiment, one electrode can be bonded to plural conductive parts 15. After the electrode 25, 26 and the conductive part 15, or the electrode 25, 26 and the conductive pad 19 are aligned, they can be bonded by thermal compression.

Referring next to FIG. 17, the second substrate 17 is separated from the first substrate 10. After that, the first substrate 10 is cut in such a way that each cut section includes a semiconductor light emitting device chip 20. Preferably, a laser beam 28 is radiated into the first substrate 10 to create a crack 29, and the first substrate 10 is then cut by a breaking process. In this manner, the first substrate 10 can be cut with less mechanical, chemical and/or thermal damage on the semiconductor light emitting device chip 20 and the encapsulating material 27. If mechanical cutting such as sawing is involved, the first substrate 10 can be cut without separating the second substrate 17 from the first substrate 10. Although the second substrate 17 can be cut together with the first substrate 17, it is better for processing to cut only the first substrate 10 and then to remove the second substrate 17. In order to separate the second substrate 17 from the first substrate 10, the bonding layer 18 may be removed by etching to separate the both substrates. In the embodiment illustrated in FIG. 17, a portion of the second plane 12 of the first substrate 10 is exposed, and the conductive part 15 including the conductive pad 19 is covered with the encapsulating material 27.

Figure 18:
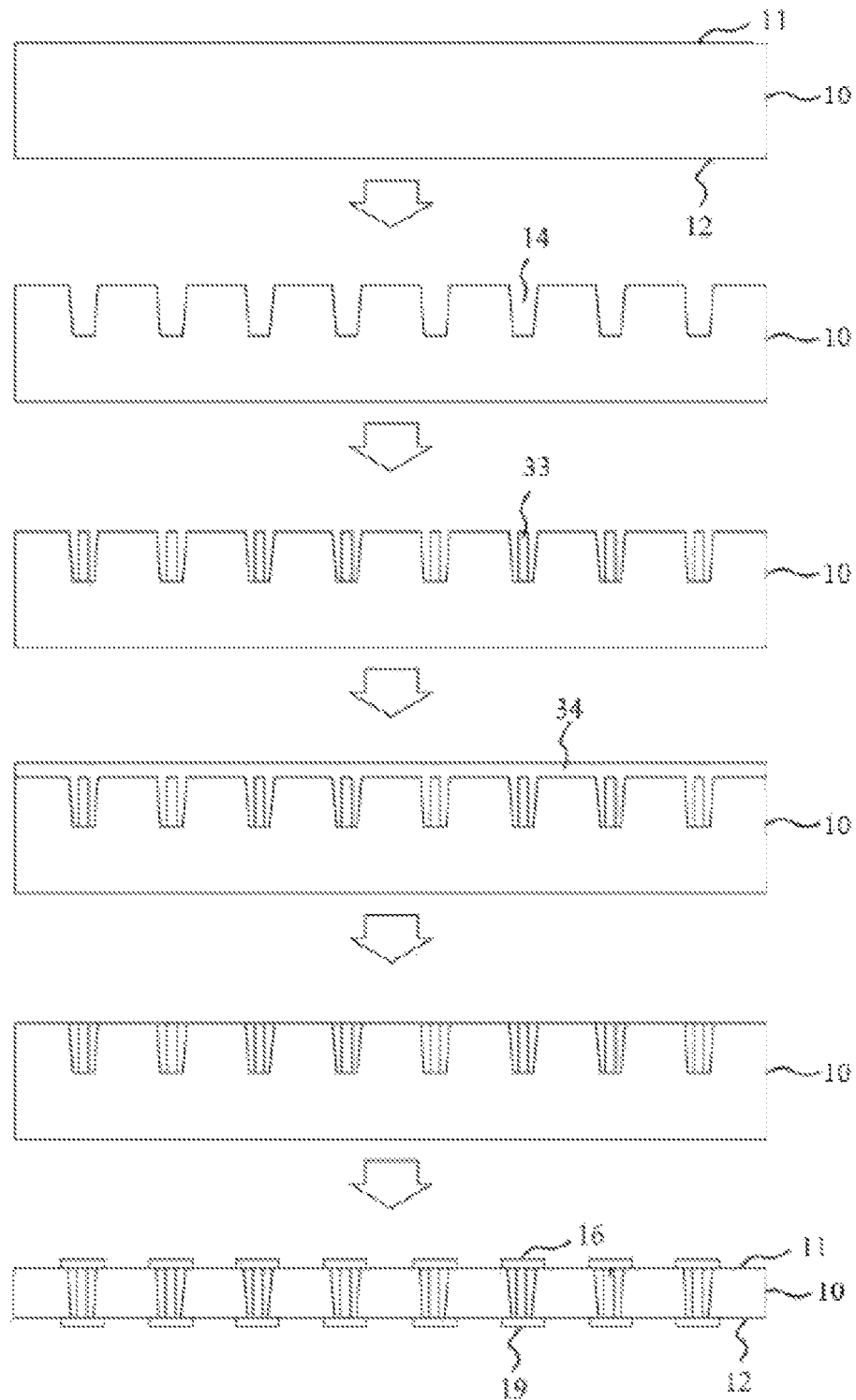
FIG. 18 shows another exemplary of a supporting substrate for a semiconductor device and an exemplary method of manufacturing the same according to one aspect of the present disclosure.

FIG. 18 shows another exemplary of a supporting substrate for a semiconductor device and an exemplary method of manufacturing the same according to one aspect of the present disclosure. The first substrate 10 as the supporting substrate for a semiconductor device has a first plane 11, a second plane 12 opposite to the first plane 11, grooves 14 extending into the first substrate 10 from the first plane 11 thereof, and an insert 33 placed and secured in each groove 14.

When a semiconductor device (power device, semiconductor optical device (semiconductor light emitting device, semiconductor light receiving device), etc.) is used with the first substrate 10 in high-power, high-temperature and high-pressure environments, although depending on the material of the first substrate 10, parasitic capacitance may be generated, causing a current leakage. Moreover, the first substrate 10 may be cracked easily due to a CTE (coefficient of thermal expansion) difference between the first substrate 10 and the insert 33. These issues can be improved somewhat by employing the fixation substance 34 including organic low-k dielectrics, such as, SOC (Spin-on-Glass), BCB (benzocyclobutene), PR (photoresist), Epoxy-based polymers, silicone, parylene, SU-8 or the like. More desirably, however, the first substrate 10 can be made of a sintered single crystalline and poly crystalline—electrical insulating oxide (e.g., $Al_2O_3$, ZnO), electrical insulating nitride (e.g., AlN, $Si_3N_4$, GaN, AlGaN), electrical insulating carbide (e.g., SiC, AlSiC) composite having a high melting point of 1500° C. or higher, which can be used in high-power, high-temperature and high-pressure environments. Therefore, this electrical insulating first substrate 10 inhibits the occurrence of parasitic capacitance and current leakage, and its high melting point makes it possible to maintain stable physical properties even at high temperatures, together providing more options for materials of the insert 33 and fixation substance 34.

Moreover, when the first substrate 10 used is single crystalline or light transmitting, a laser beam can be radiated into the first substrate 10 to facilitate the cutting process, as illustrated in FIG. 17.

Figure 19:
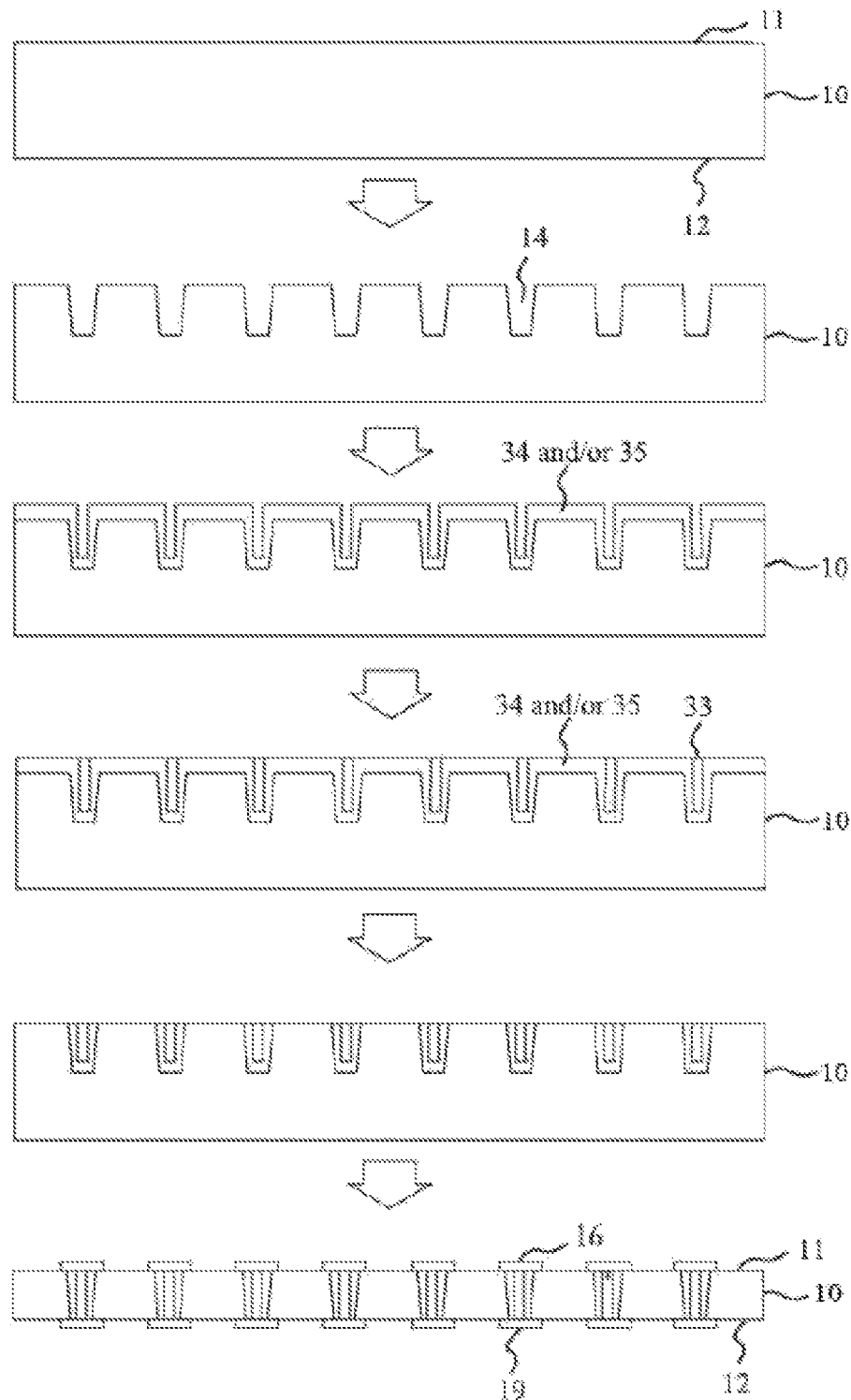
FIG. 19 shows another exemplary method of manufacturing a supporting substrate for a semiconductor device according to one aspect of the present disclosure.
Figure 20:
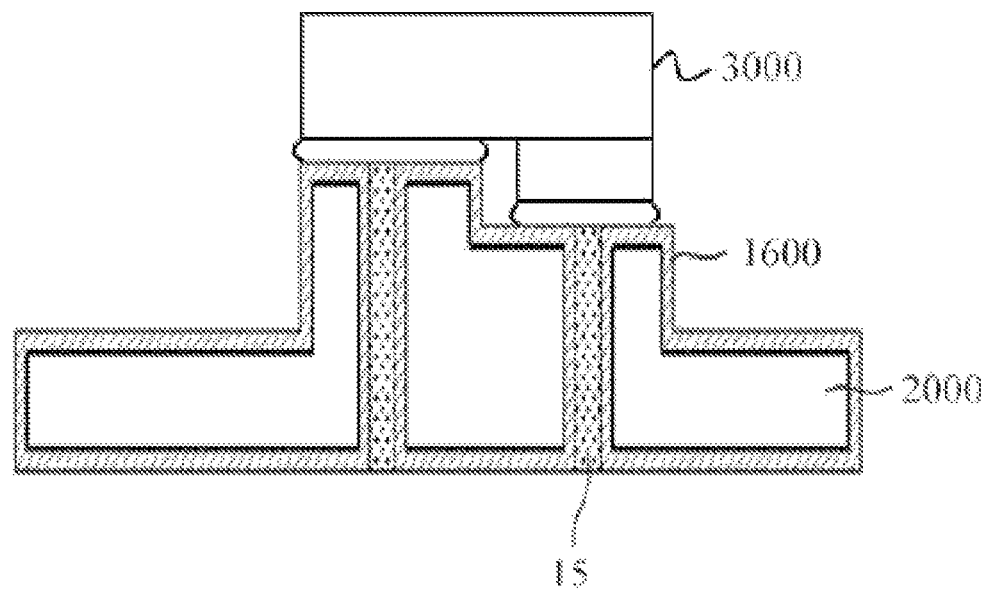
FIG. 20 shows an exemplary submount or supporting substrate for a semiconductor device described in Korean Patent Registration No. 10-1432728.

Referring to FIG. 19, optionally, the fixation substance 34 can be provided into the groove 14 before the insert 33 is placed in the groove 14. This is advantageous in that the placement of the insert 33 can be done easily as the insert 33 is placed after rough surfaces of the groove 14 due to laser drilling are covered. Once the insert 33 is placed, it undergoes drying or heat treatment to be fixed, together with the fixation substance 34, in the groove 14.

If needed, a pad 16 (a conductive pad if it serves as an electrical pass) can be provided to the insert 33 for a stable electrical and/or physical contact with the semiconductor device. Similarly, as shown in FIG. 15, a pad 19 (a conductive pad if it serves as an electrical pass) can be provided on the second plane 12 side, through polishing. In those previous processes, the second substrate 17 shown in FIG. 15 may be used on the first plane 11 side (the second substrate 17 may also be provided on the second plane 12 side). In absence of the fixation substance 34, the pad 16 and/or pad 19 can be used for securing the insert 33 into the groove 14.

For a material of the supporting substrate illustrated in FIG. 18 and FIG. 19, a sintered single crystalline and poly crystalline—electrical insulating oxide (e.g., $Al_2O_3$, ZnO), electrical insulating nitride (e.g., AlN, $Si_3N_4$, GaN, AlGaN), electrical insulating carbide (e.g., SiC, AlSiC) composite having a high melting point of 1500° C. or higher, which can be used in high-power, high-temperature and high-pressure environments is particularly suitable. The material can be determined based on the composition of a substance of the semiconductor device being supported, CTE, required electrical and heat dissipation specifications, and so on. Therefore, if this electrical insulating substrate having a high melting point of 1500° C. or higher, which can be used in high-power, high-temperature and high-pressure environments, is used, it is possible to manufacture such a supporting substrate without worrying about current leakage through the substrate (e.g., silicon substrate) due to parasitic capacitance occurred between the substrate and the insert 33, supposing that the insert 33 serves as an electrical pass. For reference, it is known that the melting point of silicon is 1414° C., $Al_2O_3$ 2040° C., AlN 2200° C., SiC 2500° C., $Si_3N_4$ 1900° C.

Figure 21:
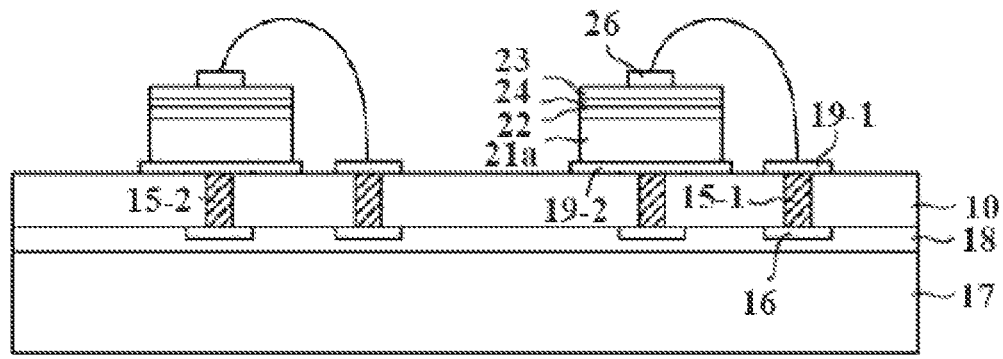
FIG. 21 shows another exemplary method of manufacturing a semiconductor device according to one aspect of the present disclosure.

FIG. 21 shows another exemplary method of manufacturing a semiconductor device according to one aspect of the present disclosure. Here, a semiconductor light emitting device is taken as an example. A vertical chip using a growth substrate 21a is mounted on the first substrate 10. The second electrode 26 is electrically connected to the second semiconductor layer 23, and to a pad 19-1 and an insert 15-1 through wires. The first semiconductor layer 22 is electrically connected to a pad 19-2 and an insert 15-2 through the growth substrate 21a. Another electrode can be present under the growth substrate 21a, and the growth substrate 21a and the vertical chip can be secured by one of conventional schemes known in the art. Other components with reference numerals that are already described above will not be discussed here again. In addition, if needed for processing, the second substrate 17 can be provided on the pad 16 side of the first substrate 10, using the bonding layer 18. Alternatively, the second substrate 17 can be provided on the pad 19 side of the first substrate 10.

Figure 22:
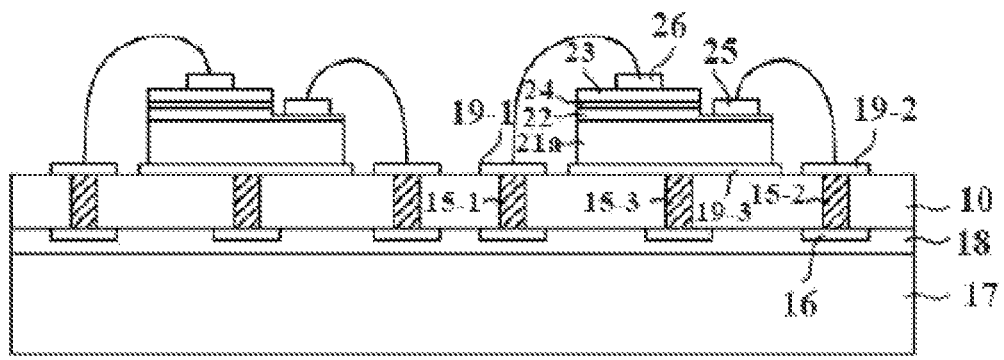
FIG. 22 shows another exemplary method of manufacturing a semiconductor device according to one aspect of the present disclosure.

FIG. 22 shows another exemplary method of manufacturing a semiconductor device according to one aspect of the present disclosure. Here, a semiconductor light emitting device is taken as an example. A lateral chip using a growth substrate 21a is mounted on the first substrate 10. The first electrode 25 is electrically connected to the first semiconductor layer 22, and the second electrode 26 is electrically connected to the second semiconductor layer 23. The first electrode 25 is electrically connected to the pad 19-2 and the insert 15-2 through wires, and the second electrode 26 is electrically connected to the pad 19-1 and the insert 15-1 through wires. Preferably, a pad 19-3 and an insert 15-3 are additionally provided and serve as a heat dissipation pass from the semiconductor chip. If the growth substrate 21a can be conductive, a separate insulation layer can be present between the pad 19-3 and the growth substrate 21a, or alternatively, the pad 19-3 may be replaced with a non-conductive material.

Set out below are clauses that describe diverse features of further aspects of the present disclosure.

(1) A template for growing Group III-nitride semiconductor layers, comprising: a growth substrate having a first plane, a second plane opposite to the first plane and a groove extending inwards the growth substrate from the first plane; an insert for heat dissipation placed and secured in the groove; and a nucleation layer formed on a partially removed portion of the first plane, wherein the partially removed portion of the first plane is obtained by removing the surface of the first plane and/or forming the groove originating from the first plane.

(2) There is also provided, the template for growing Group III-nitride semiconductor layers of clause (1) wherein the insert for heat dissipation is made of a ferromagnetic metal.

(3) There is also provided, the template for growing Group III-nitride semiconductor layers of clause (1) wherein the insert for heat dissipation has a bonding wire form.

(4) There is also provided, the template for growing Group III-nitride semiconductor layers of clause (1) wherein the insert for heat dissipation is formed by heat treatment of one of metal powder, alloy powders and ceramic powder.

(5) There is also provided, the template for growing Group III-nitride semiconductor layers of clause (1) comprising: a fixation substance for securing the insert for heat dissipation in the groove.

(6) There is also provided, the template for growing Group III-nitride semiconductor layers of clause (1) further comprising: a high reflectivity substance disposed between the growth substrate and the fixation substance within the groove, or between the growth substrate and the insert for heat dissipation within the groove.

(7) There is also provided, the template for growing Group III-nitride semiconductor layers of clause (1) wherein the insert for heat dissipation is extended from the first plane to the second plane.

(8) There is also provided, the template for growing Group III-nitride semiconductor layers of clause (1) wherein the insert for heat dissipation extends inwards from the first plane up to a point before reaching the second plane of the growth substrate.

(9) There is also provided, the template for growing Group III-nitride semiconductor layers of clause (1) wherein the nucleation layer is made of AlN or AlNO.

(10) There is also provided, the template for growing Group III-nitride semiconductor layers of clause (1) wherein protrusions are formed on the first plane.

(11) A Group III-nitride semiconductor light emitting device comprising: a growth substrate having a first plane, a second plane opposite to the first plane and a groove extending inwards the growth substrate from the first plane; an insert for heat dissipation placed and secured in the groove; a nucleation layer formed on a partially removed portion of the first plane; a plurality of Group III-nitride semiconductor layers grown on the nucleation layer in the sequence of a first semiconductor layer having a first conductivity (e.g., n-type Group III-nitride semiconductor layer), an active layer for generating light by recombination of electrons and holes, and a second semiconductor layer having a second conductivity; a first electrode electrically connected to the second semiconductor layer; and a second electrode electrically connected to the first semiconductor layer.

(12) There is also provided, the Group III-nitride semiconductor light emitting device of clause (11) wherein the second electrode is electrically connected to the first semiconductor layer through the insert for heat dissipation.

(13) There is also provided, the Group III-nitride semiconductor light emitting device of clause (11) wherein the second electrode is formed on the second plane side of the growth substrate.

(14) There is also provided, the Group III-nitride semiconductor light emitting device of clause (11) further comprising: an ohmic electrode provided on an etch-exposed portion of the first semiconductor layer and electrically connected to the insert for heat dissipation.

(15) There is also provided, the Group III-nitride semiconductor light emitting device of clause (11) wherein the first electrode is electrically connected to the second semiconductor layer through the insert for heat dissipation.

(16) There is also provided, the Group III-nitride semiconductor light emitting device of clause (11) further comprising: a back-side electrode formed on the second plane side of the growth substrate and electrically connected to the first electrode through the insert for heat dissipation.

(17) There is also provided, the Group III-nitride semiconductor light emitting device of clause (11) wherein an additional groove is formed in the growth substrate, wherein the device further comprises: an additional insert for heat dissipation place and secured in the additional groove; and a back-side electrode formed on the second plane side of the growth substrate and electrically connected to the first electrode through the additional insert for heat dissipation, and wherein the second electrode is formed on the second plane side of the growth substrate and electrically connected to the first semiconductor layer through the insert for heat dissipation.

(18) There is also provided, the Group III-nitride semiconductor light emitting device of clause (11) further comprising: an insert for heat dissipation, which is not electrically connected to the first and second electrodes.

(19) There is also provided, the Group III-nitride semiconductor light emitting device of clause (11) wherein the first electrode is formed on the second semiconductor layer, the second electrode is formed on an etch-exposed portion of the first semiconductor layer, and the Group III-nitride semiconductor light emitting device is a flip chip.

(20) There is also provided, the Group III-nitride semiconductor light emitting device of clause (11) wherein the active layer emits ultraviolet rays, and the nucleation layer contains Al not to absorb the ultraviolet rays.

(21) There is also provided, the Group III-nitride semiconductor light emitting device of clause (11) further comprising: a high reflectivity substance which is disposed in the groove between the growth substrate and the insert and serves to prevent the light generated in the active layer from being absorbed by the insert.

(22) There is also provided, the Group III-nitride semiconductor light emitting device of clause (11) wherein protrusions for scattering light are formed on the first plane of the growth substrate.

(23) A method of manufacturing a template for growing Group III-nitride semiconductor layers, comprising the steps of: forming, in a growth substrate having a first plane and a second plane opposite to the first plane, a groove extending inwards the growth substrate from the first plane; placing an insert for heat dissipation in the groove; and forming, on the first plane, a nucleation layer by a PVD (Physical Vapor Deposition) process.

(24) A method of manufacturing a Group III-nitride semiconductor light emitting device, comprising the steps of: forming, in a growth substrate having a first plane and a second plane opposite to the first plane, a groove extending inwards the growth substrate from the first plane; placing an insert for heat dissipation in the groove; forming, on the first plane, a nucleation layer by a first deposition process; growing, on the nucleation layer, a plurality of Group III-nitride semiconductor layers in sequence by a second deposition process different from the first deposition process, the plurality of Group III-nitride semiconductor layers including a first semiconductor layer having a first conductivity, an active layer for generating light by recombination of electrons and holes, and a second semiconductor layer having a second conductivity different from the first conductivity; and electrically connecting the first electrode to the second semiconductor layer and the second electrode to the first semiconductor layer, respectively.

(25) A method of manufacturing a Group III-nitride semiconductor light emitting device, comprising the steps of: growing a plurality of Group III-nitride semiconductor layers on a growth substrate having a first plane and a second plane opposite to the first plane; removing a portion of the plurality of Group III-nitride semiconductor layers and then a portion of the first plane of the growth substrate to form a groove that extend inwards the growth substrate; placing an insert for heat dissipation in the groove; and electrically connecting the plurality of Group III-nitride semiconductor layers and the insert for heat dissipation.

(26) There is also provided, the method of manufacturing a Group III-nitride semiconductor light emitting device of clause (25) further comprising the step of: prior to the step of growing a plurality of Group III-nitride semiconductor layers, forming protrusions for scattering light on the first plane of the growth substrate.

(27) There is also provided, the method of manufacturing a Group III-nitride semiconductor light emitting device of clause (26) wherein the step of forming protrusions for scattering light involves forming protrusions for scattering light on the first plane excluding a region where the insert is to be formed.

(28) There is also provided, the method of manufacturing a Group III-nitride semiconductor light emitting device of clause (25) comprising the step of: prior to the step of growing a plurality of Group III-nitride semiconductor layers, forming a nucleation layer on the first plane by a process different from the process used for growing the plurality of Group III-nitride semiconductor layers.

(29) A method of manufacturing a semiconductor light emitting device, comprising the steps of: preparing a first substrate having a first plane and a second plane opposite to the first plane, and a first and a second grooves extended from the first plane side towards the second plane side, wherein the first and second grooves have conductive parts, respectively, showing limited thermal expansion in the grooves; bonding a second substrate to the first substrate with a bonding layer on the first plane side; and fixing, to the first substrate, a semiconductor light emitting chip on the second plane side, with the semiconductor light emitting chip comprising a growth substrate; a plurality of semiconductor layers grown on the growth substrate, including a first semiconductor layer having a first conductivity, a second semiconductor layer having a second conductivity different from the first conductivity, and an active layer disposed between the first semiconductor layer and the second semiconductor layer and adapted to generate light by recombination of electrons and holes; and a first and a second electrode electrically connected to the first and second semiconductor layers, respectively, wherein the step of fixing involves fixing the first and second electrodes to the conductive parts of the first and second grooves, respectively.

The first substrate 10 can be a ceramic substrate, an $Al_2O_3$ crystal substrate, an AlN crystal substrate, an HTCC substrate, an LTCC substrate, an $Al_2O_3$ mixture or ceramic substrate, an $Al_2O_3$—$ZrO_2$ mixture or ceramic substrate, or an AlN mixture or ceramic substrate.

As the conductive part 15 usually made of a metal is positioned in the groove 14, its thermal expansion can be suppressed.

The first substrate 10 has a thickness ranging between 10 and 2000 μm. If it is extremely thin, it will not function properly as a supporting substrate. The first substrate 10 preferably has a thickness ranging between 30 and 500 μm. If it is extremely thick, processing time (e.g., the polishing process) can be unnecessarily prolonged.

For instance, the groove 14 can be 30 μm in width and have a varying length depending on the length of the electrodes 25 and 26. There may be a plurality of grooves 14 for one electrode 25. If the groove 14 has a hole form, a suitable length for one side of the groove is 200 μm or less. The groove 14 preferably has a width ranging between 30 and 200 μm. If the groove 14 is too narrow, heat dissipation properties can be deteriorated. If the groove 14 is too wide, the first substrate 10 can be cracked. In general, the size of the groove 14 may vary depending on the shape of the electrodes 25 and 26. For instance, the groove 14 may be formed in depth greater than about 10% of the thickness of the polished, first substrate 10.

The conductive part 15 including the conductive pad 16 can be formed by forming a seed layer with E-beam or a sputter for example, followed by plating the seed layer. Examples of the plating substance include Cu, Ni, Au, Ag, In and Sn. An Ag or Cu-based electrically conductive paste may be used for the conductive part 15. In addition, an electrically conductive paste containing Graphite, CT, AlN or SiC may also be used. The conductive pad 16 can be made of one of Au, Ag, Pt, Pd, Cu, Ni, Cr, Sn, In, Zn, Ti, and TiW, or any combination thereof, and may be formed into layers. It is prepared together with the conductive part 15 or separately. The conductive pad 16 may be made of an Ag or Cu-based electrically conductive paste. It is understood that the conductive part 15 and/or conductive pad 16 can be formed after the first substrate 10 and the second substrate 17 are bonded. Alternatively, a portion of the conductive part 15 can be primarily formed by plating, and the other portion of the conductive part 15 can be filled with a conductive paste. In order to accomplish an increased electrical conductivity as well as to suppress thermal expansion, the conductive paste is usually used together with those conductive metals since the conductive metals have a low electric resistance yet they undergoes thermal expansion.

The second substrate 17 can be made of electrical insulating substances, including, for example, glass, sapphire, an $Al_2O_3$ mixture, an $Al_2O_3$—$ZrO_2$ mixture, an AlN mixture, silicon, and oxide ceramics. The second substrate 17 can be bonded to the first substrate 10 with the bonding layer 18, and alternatively, the second substrate 17 can be deposited on the first substrate 10. The second substrate 17 thus formed can be removed by etching. The first substrate 10 and the second substrate 17 may be made of the same substance so as to have the same or similar coefficients of thermal expansion. For instance, both the first substrate 10 and the second substrate 17 can be made of sapphire.

Preferably, semiconductor light emitting device chips 20 are fixed at regular intervals.

An insulator can be provided between the first electrode 25 and the second electrode 26, and the insulator can include a thermo-setting or thermos-plastic resin, e.g., a phenol resin, an epoxy resin, a BT resin, PPA, or silicon resin.

(30) There is also provided, the method of manufacturing a semiconductor light emitting device of clause (29) comprising the step of: prior to the step of fixing, reducing thickness of the first substrate while the first and second substrates are in a secured state.

(31) There is also provided, the method of manufacturing a semiconductor light emitting device of clause (29) wherein the first substrate has a reduced thickness ranging between 30 and 500 μm. If the first substrate is extremely thin, it cannot function properly as a supporting substrate. If the first substrate is extremely thick, it is difficult to cut it and may be hard to fit in a package as shown in FIG. 15.

(32) There is also provided, the method of manufacturing a semiconductor light emitting device of clause (29) further comprising the step of: prior to the step of fixing, forming a conductive pad at the conductive part on the second plane side.

The conductive pad 19 can be formed by plating or deposition. The conductive pad 19 can be made of one of Au, Ag, Pt, Pd, Cu, Ni, Cr, Sn, Ln, Zn, Ti and TiW, or any combination thereof, and may be formed into layers. In addition, the conductive pad 16 may be made of an Ag or Cu-based electrically conductive paste. A reflective or insulation layer 12a can be provided between the conductive pads 19 on the first substrate 10. If the reflective layer 12a is present, it can be made of a high reflectivity material such as Ag, Al, Rh, Cr, Ti, TiW, Au, DBR or OBR. If the insulation layer 12a is present, it can be made of $SiO_2$, $TiO_2$, $ZrO_2$, $Al_2O_3$, DBR, SOG (Spin On Gel), epoxy or resin. If the reflective or insulation layer 12a serves as an insulation layer for the conductive pads 19 disposed on either side thereof, the insulation layer 12a preferably has a height greater than the height of the conductive pads 19.

(33) There is also provided, the method of manufacturing a semiconductor light emitting device of clause (29) further comprising the step of: forming, on the second plane side, an encapsulating material for covering the semiconductor light emitting chip.

The encapsulating material can include phosphors and/or light scattering materials formed in a single layer or multi-layers. Each layer may be transparent or contain different kinds of phosphors.

(34) There is also provided, the method of manufacturing a semiconductor light emitting device of clause (29) wherein the step of forming the encapsulating material involves a process of exposing lateral faces of the encapsulating material.

For instance, a portion of the encapsulating material 27 can be removed by a laser ablation, dicing or cutting process.

(35) There is also provided, the method of manufacturing a semiconductor light emitting device of clause (29) further comprising the step of: separating the second substrate from the first substrate.

The second substrate 17 can be removed by polishing or wet etching. If the bonding layer 18 or the second substrate 17 is made of a light-responsive material, it can be removed by an optical process (light).

(36) There is also provided, the method of manufacturing a semiconductor light emitting device of clause (29) wherein the step of separating involves a process of removing the bonding layer.

A tape can be used as the bonding layer 18. Alternatively, the bonding layer 18 can be obtained by depositing a metal, oxide or nitride which is later removed by etching. Alternatively, the bonding layer 18 is made of a material that can be removed by heat release, thermal-chemical decomposition, optical-chemical decomposition, optical-thermal-chemical decomposition.

(37) There is also provided, the method of manufacturing a semiconductor light emitting device of clause (29) further comprising the step of: cutting the first substrate in such a way that each cut section includes a semiconductor light emitting device chip.

The encapsulating material 27 does not need to have only one semiconductor light emitting device chip 20 in it. Rather, it can have a plurality of semiconductor light emitting device chips 20 in it. Moreover, the plurality of semiconductor light emitting device chips 20 does not necessarily have to emit the same color, as it can emit diverse colors including blue, green, ultraviolet, and so on. An ESD protection device can also be provided.

The cutting step is done by laser ablation or using a dicing saw.

(38) There is also provided, the method of manufacturing a semiconductor light emitting device of clause (29) further comprising the step of: prior to the step of cutting, creating a crack inside the first substrate.

The crack can be created using a stealth laser.

(39) There is also provided, the method of manufacturing a semiconductor light emitting device of clause (29) wherein a conductive pad is formed at least one of the first and second plane sides of the conductive part.

(40) There is also provided, the method of manufacturing a semiconductor light emitting device of clause (29) wherein a plurality of conductive parts if fixed on the first electrode or the second electrode.

(41) There is also provided, the method of manufacturing a semiconductor light emitting device of clause (29) further comprising the steps of: forming an encapsulating material on the second plane side in such a way that the semiconductor light emitting device chip is covered; and cutting the first substrate in such a way that each cut section includes a semiconductor light emitting device chip, wherein a portion of the second plane of the first substrate being cut is exposed without the encapsulating material.

The region to be exposed should not exceed 100 μm in length. If the region is too broad, material loss will increase. When the stealth laser is used, a suitable distance between chips for processing is approximately 30 μm.

(42) There is also provided, the method of manufacturing a semiconductor light emitting device of clause (29) wherein the step of preparing the first substrate involves forming a conductive pad on at least one of the first and second plane sides of the conductive part.

(43) There is also provided, the method of manufacturing a semiconductor light emitting device of clause (29) further comprising the steps of: forming, on the second plane side, an encapsulating material in such a way that the semiconductor light emitting device chip is covered; and prior to the step of forming the encapsulating material, forming, on the second plane side, a dam next to the semiconductor light emitting device chip at the first substrate.

The dam 30 can be formed of a dry film and PR. The dam can serve as a reflective layer, and EMC, white silicone, or $TiO_2$-containing silicone may be used therefor.

(44) A method of manufacturing a supporting substrate for a semiconductor device, comprising the steps of: preparing a first substrate having a first plane and a second plate opposite to the first plane; forming a groove extending from the first plane towards the second plane; and placing and securing an insert in the groove to form a pass running through the first substrate, with the pass serving as at least one of a heat dissipation pass and an electrical pass.

(45) There is also provided, the method of manufacturing a supporting substrate for a semiconductor device of clause (44) wherein the insert is secured in the groove by a fixation substrate.

(46) There is also provided, the method of manufacturing a supporting substrate for a semiconductor device of clause (44) further comprising the step of: prior to the step of placing the insert, forming a fixation substrate on the first plane side.

(47) There is also provided, the method of manufacturing a supporting substrate for a semiconductor device of clause (45) wherein the fixation substance includes a bonding metal substance.

(48) There is also provided, the method of manufacturing a supporting substrate for a semiconductor device of clause (44) further comprising the step of: prior to the step of placing the insert, forming a fixation substance in the groove.

(49) There is also provided, the method of manufacturing a supporting substrate for a semiconductor device of clause (44) wherein the insert has a rod shape cut out of a solid phase wire. Here, since the groove is deeper than it is wide, the insert, although it has a µm scale, is shaped into a rod in general.

(50) There is also provided, the method of manufacturing a supporting substrate for a semiconductor device of clause (44) wherein the insert is placed in the groove, in the form of a continuous liquid-phase wire.

(51) There is also provided, the method of manufacturing a supporting substrate for a semiconductor device of clause (44) wherein the insert is formed by putting powder into the groove, followed by heat treatment of the powder.

(52) There is also provided, the method of manufacturing a supporting substrate for a semiconductor device of clause (44) wherein after the insert is placed, at least one of the first and second planes is polished.

(53) There is also provided, the method of manufacturing a supporting substrate for a semiconductor device of clause (44) wherein after the insert is placed and secured, the second plane is polished.

(54) There is also provided, the method of manufacturing a supporting substrate for a semiconductor device of clause (44) wherein the insert, together with the fixation substance, are placed on the first plane before the insert is placed in the groove.

(55) There is also provided, the method of manufacturing a supporting substrate for a semiconductor device of clause (44) wherein the first substrate is made of an electrical insulating substance.

(56) Combinations of the above-described embodiments.

With a template for growing Group III-nitride semiconductor layers, a Group III-nitride semiconductor light emitting device, and methods of manufacturing the same according to one aspect of the present disclosure, it becomes possible to improve heat dissipation within the device.

With a template for growing Group III-nitride semiconductor layers, a Group III-nitride semiconductor light emitting device, and methods of manufacturing the same according to another aspect of the present disclosure, a first and a second electrode can be built in diverse forms, allowing design flexibility of a package.

With a supporting substrate for a semiconductor device according to one aspect of the present disclosure, semiconductor device chips are protected from cracking or breaking.

With a semiconductor device according to one aspect of the present disclosure, semiconductor device chips are protected from cracking or breaking.

With a method of manufacturing a semiconductor device according to one aspect of the present disclosure, semiconductor device chips are protected from cracking or breaking.

With a supporting substrate for a semiconductor device according to one aspect of the present disclosure, technical issues of forming an electrical pass or a heat dissipation pass can be improved by performing a plating process on the supporting substrate.

With a supporting substrate for a semiconductor device according to one aspect of the present disclosure, differences in coefficients of thermal expansion and lattice constants between the supporting substrate and the semiconductor device can be well matched, and at the same time, technical issues of forming an electrical pass or a heat dissipation pass can be improved by performing a plating process on the supporting substrate.

What is claimed is:

1. A method of manufacturing a template for growing Group III-nitride semiconductor layers, the template comprising: a growth substrate having a first plane, a second plane opposite to the first plane and a groove extending from the first plane toward the second plane; an insert for heat dissipation placed and secured in the groove; and a nucleation layer formed on the first plane, the method comprising the steps of:
    forming the groove extending from the first plane of the growth substrate toward the second plane of the growth substrate;
    placing an entirety of the insert for heat dissipation within the groove; and
    forming the nucleation layer for growing the Group III-nitride semiconductor layers directly on the first plane of the growth substrate in a state that covers the insert inside the groove.

2. The method of manufacturing the template for growing Group III-nitride semiconductor layers of claim 1, wherein the insert for heat dissipation is made of a ferromagnetic metal.

3. The method of manufacturing the template for growing Group III-nitride semiconductor layers of claim 1, wherein the insert for heat dissipation has a bonding wire form.

4. The method of manufacturing the template for growing Group III-nitride semiconductor layers of claim 1, wherein the insert for heat dissipation is formed by heat treatment of one of metal powder, alloy powders and ceramic powder.

5. The method of manufacturing the template for growing Group III-nitride semiconductor layers of claim 1, further comprising:
    forming a fixation substance for securing the insert for heat dissipation in the groove prior to forming the nucleation layer.

6. The method of manufacturing the template for growing Group III-nitride semiconductor layers of claim 5, further comprising:
    forming a high reflectivity substance disposed between the growth substrate and the fixation substance within the groove.

7. The method of manufacturing the template for growing Group III-nitride semiconductor layers of claim 1, wherein the insert for heat dissipation extends from the first plane to the second plane.

8. The method of manufacturing the template for growing Group III-nitride semiconductor layers of claim 1, wherein the insert for heat dissipation extends from the first plane up to a point before reaching the second plane of the growth substrate.

9. The method of manufacturing the template for growing Group III-nitride semiconductor layers of claim 1, wherein the nucleation layer is made of AlN or AlNO.

10. The method of manufacturing the template for growing Group III-nitride semiconductor layers of claim 1, wherein a plurality of protrusions are formed on the first plane.

* * * * *